US008189405B2

(12) United States Patent
Murata et al.

(10) Patent No.: US 8,189,405 B2
(45) Date of Patent: May 29, 2012

(54) DATA READOUT CIRCUIT AND SEMICONDUCTOR MEMORY DEVICE

(75) Inventors: Nobukazu Murata, Tokyo (JP); Katsuaki Matsui, Tokyo (JP)

(73) Assignee: OKI Semiconductor Co., Ltd., Tokyo (JP)

( * ) Notice: Subject to any disclaimer, the term of this patent is extended or adjusted under 35 U.S.C. 154(b) by 427 days.

(21) Appl. No.: 12/503,894

(22) Filed: Jul. 16, 2009

(65) Prior Publication Data

US 2010/0014362 A1    Jan. 21, 2010

(30) Foreign Application Priority Data

Jul. 18, 2008    (JP) ................................. 2008-187721

(51) Int. Cl.
*G11C 16/04*    (2006.01)
(52) U.S. Cl. ......... 365/189.09; 365/189.11; 365/189.15; 365/207
(58) Field of Classification Search ............. 365/189.09, 365/189.11, 189.15, 226, 207
See application file for complete search history.

(56) References Cited

U.S. PATENT DOCUMENTS 7,692,979 B2 *    4/2010    Fuji et al. ................. 365/189.15

FOREIGN PATENT DOCUMENTS

JP            02-033800            2/1990

* cited by examiner

*Primary Examiner* — David Lam
(74) *Attorney, Agent, or Firm* — Volentine & Whitt, PLLC

(57) ABSTRACT

A data readout circuit including a 1st PMOS transistor operating in saturation and including a source connected to a power supply, a drain connected to an input terminal a memory cell, and a gate connected to a 1st bias voltage; a 2nd PMOS transistor including a source connected to the drain of the 1st PMOS transistor, a drain connected to an output terminal, and a gate connected to a 2nd bias voltage; a 1st NMOS transistor including a drain connected to the drain of the 2nd PMOS transistor, a source grounded, and a gate connected to a 3rd bias voltage; and a bias voltage section causing the 2nd PMOS transistor to operate in saturation, and supplying the 2nd bias voltage adjusted so as to keep a reference voltage of the input terminal at a junction point between the drain and the source of the 1st and 2nd PMOS transistors respectively.

10 Claims, 14 Drawing Sheets

US 8,189,405 B2

DATA READOUT CIRCUIT AND SEMICONDUCTOR MEMORY DEVICE

BACKGROUND OF THE INVENTION

1. Field of the Invention

The present invention relates to a data readout circuit and a semiconductor memory device, and particularly to a data readout circuit for reading data out from a memory cell of a data readout object and to a semiconductor memory device comprising the said data readout circuit.

2. Description of the Related Art

There is a disclosure of a sense amplifier circuit (a current source type sense amplifier circuit) relative to the data readout from a semiconductor memory cell such as an EPROM and the like in the publication of Japanese Patent No. 2513795, the sense amplifier circuit having functions for applying a constant voltage to a data line connected to the semiconductor memory cell and for detecting a current value sufficient to keep a constant voltage in said data line. For example, as shown in FIG. 15A, the sense amplifier circuit 200 disclosed in the particular Japanese Patent publication comprises: a PMOS (P-channel Metal Oxide Semiconductor) transistor 202 having a source connected to the power supply Vcc, a gate to which the bias voltage $V_{BIASP}$ is supplied via the bias voltage input terminal, and a drain connected to the output terminal OUTB; a NMOS (N-channel Metal Oxide Semiconductor) transistor 204 having a drain connected to a drain of the PMOS transistor 202, and a source connected to the input terminal BL; and an operational amplifier 206 having an inversion input terminal connected to the drain of the NMOS transistor 204, a non-inversion input terminal to which the reference voltage $V_{BLREF}$ is supplied via the reference voltage input terminal, and an output terminal connected to the gate of the NMOS transistor 204.

Besides a function similar to the sense amplifier circuit 200 may be realized by a sense amplifier circuit 210 as shown in FIG. 15B which comprises: a PMOS transistor 212 having a source connected to the power supply Vcc, a gate to which the bias voltage $V_{BIASP}$ is supplied via the bias voltage input terminal, and a drain connected to the output terminal OUTB; a PMOS transistor 214 having a source connected to a drain of the PMOS transistor 212, and a drain connected to the input terminal BL; and an operational amplifier 216 having a non-inversion input terminal connected to a drain of the PMOS transistor 214, an inversion input terminal to which the reference voltage $V_{BLREF}$ is supplied via the reference voltage input terminal, and an output terminal connected to a gate of the PMOS transistor 214.

The sense amplifier circuits 200 are connected to the semiconductor memory cell so as to enable to readout data from the semiconductor memory cell since each of the sense amplifier circuits 200 is used as the readout sense amplifier circuit READAMPn (n=0, 1, . . . ) and the reference sense amplifier circuit REFAMP in the amplifier block circuit 220 as shown in FIG. 16. Namely, the bias voltage $V_{BIASP}$ is supplied to each of the sense amplifier circuits 200 via the bias voltage supply line connected to the bias voltage input terminal as well as the reference voltage $V_{BLREF}$ is supplied to each of the sense amplifier circuits 200 via the reference voltage supply line connected to the reference voltage input terminal. In addition, the sense amplifier circuit 200 constituting the readout sense amplifier circuit READAMPn comprises: an input terminal BL connected to the drain terminal of the semiconductor memory cell via the bit line (the data line) BLn; and an output terminal OUTB connected to the inversion input terminal of the operational amplifier 222n. In addition, the sense amplifier circuit 200 constituting the reference sense amplifier circuit REFAMP comprises: an input terminal BL in which the reference outflow current $I_{BLR}$ flows; and output terminals OUTB connected to the non-inversion input terminals of the operational amplifiers 222n respectively. Besides the readout sense amplifier circuit READAMPn and the reference sense amplifier circuit REFAMP may be comprised of the sense amplifier circuit 210 instead of the sense amplifier circuit 200.

When reading data out from the semiconductor memory cell, generally, the drain terminal of the semiconductor memory cell is kept at a constant voltage. In the sense amplifier circuit 200, 210, the operational amplifiers 206, 216 work as a differential amplifier circuit, so that the voltage of the bit line BLn connected to the input terminal BL is kept at the reference voltage $V_{BLREF}$ supplied to the operational amplifier 206, 216 as well as the voltage of the drain terminal of the semiconductor memory cell connected to the bit line BLn is kept at a voltage equivalent to the reference voltage $V_{BLREF}$. In addition, an electric current flows from the input terminal BL to the bit line BLn at the time of data readout from the semiconductor memory cell, and then an output voltage of the output terminal OUTB decreases according to such a flow of current. However, the amount of reduction of the output voltage changes according to the amount of the outflow current $I_{BL}$ through the bit line BLn and then, the amount of the outflow current $I_{BL}$, for example, as shown in FIG. 17A, data stored in the semiconductor memory cell of a data readout object (i.e., readout objective data) differ in response to "0" or "1".

The reference sense amplifier circuit REFAMP of the amplifier block circuit 220 is provided in order to judge an amount of the outflow current $I_{BL}$ (an amount of reduction of the output voltage) corresponding to "0" or "1" of the readout objective data. For example as shown in FIG. 17B, the circuit is configured so that the output voltage of the output terminal OUTB (i.e., reference voltage $V_{REF}$ inputted into each operational amplifier 222n) becomes a level equal to the middle voltage both of the output voltage after decreased when the readout objective data is "0" and the output voltage after decreased when the readout objective data is "1". Besides in FIG. 17B the voltage at the output terminal OUTB is notated as "OUTB" and the voltage at the bit line is notated as "BL" and, the voltages at the bit line are overlapped because there is little difference between the voltages at the bit line in the readout objective data "0" and "1".

As described above, to set the reference voltage $V_{REF}$ to be equal to the said middle voltage can be realized by setting the reference outflow current $I_{BLR}$ flowing through the input terminal BL of the reference sense amplifier circuit REFAMP equal to the middle amount both of the outflow current $I_{BL}$ when the readout objective data is "1" and the outflow current $I_{BL}$ when the readout objective data is "0". By this, the readout objective data "0" or "1" may be discriminated on the basis of output from each operational amplifier 222n operating as a differential amplifier.

By the way, in the sense amplifier circuit 200, 210, the greater the outflow current $I_{BL}$ flows through the bit line BL, the greater the output voltage of the output terminal OUTB considerably decreases as described above. Therefore, it is preferable to the operation of each of the PMOS transistor 202 and the NMOS transistor 204 of the sense amplifier circuit 200, and the PMOS transistors 212, 214 of the sense amplifier circuit 210 is performed in the saturation region, in order to improve the voltage gain of the output voltage.

Thus, in the sense amplifier circuit 200, providing that a voltage between a source and a drain of the PMOS transistor 202 is $V_{SDP}$, the threshold voltage of the PMOS transistor 202 is $V_{TP}$, a voltage between a drain and a source of the NMOS transistor 204 is $V_{DSN}$, a voltage between a gate and a source of the NMOS transistor 204 is $V_{GSN}$, and the threshold voltage of the NMOS transistor 204 is $V_{TN}$ as parameters, then the operations of the PMOS transistor 202 and the NMOS transistor 204 of the sense amplifier circuit 200 in the saturation region can be realized by satisfying the following formula (1) for the PMOS transistor 202 and the following formula (2) for the NMOS transistor 204 respectively:

$$V_{SDP} > Vcc - V_{BIASP} - |V_{TP}| \qquad (1)$$

$$V_{DSN} > V_{GSN} - V_{TN} \qquad (2).$$

From the formulae (1), (2), the following formula (3) is obtained:

$$V_{SDP} + V_{DSN} > Vcc - V_{BIASP} - |V_{TP}| + V_{GSN} - V_{TN} \qquad (3).$$

In addition, the PMOS transistor 202 and the NMOS transistor 204 are connected in series between the power supply Vcc and the input terminal BL (i.e., bit line BLn), and the voltage of the bit line BLn is maintained at the reference voltage $V_{BLREF}$. Therefore, the following formula (4) is established:

$$Vcc - V_{BLREF} = V_{SDP} + V_{DSN} \qquad (4).$$

From the formulae (3), (4), the following formula (5) is obtained:

$$V_{BLREF} < V_{BIASP} + |V_{TP}| - V_{GSN} + V_{TN} \qquad (5).$$

Accordingly, if the formula (5) is satisfied in the sense amplifier circuit 200 then the PMOS transistor 202 and the NMOS transistor 204 operate in the saturation regions. Such operations can be realized normally by adjusting the bias voltage $V_{BIASP}$ etc. However, it is difficult to satisfy the formula (5) if the power supply Vcc is a relatively low voltage and the reference voltage $V_{BLREF}$ is a relatively high voltage. As a result, the PMOS transistor 202 and the NMOS transistor 204 do not operate in the saturation region, so that fatal inconveniences such as the gain reduction etc. occurs and the voltage at the bit line is not kept at the reference voltage $V_{BLREF}$ or the like.

Furthermore, in the sense amplifier circuit 210, providing that a voltage between a source and a drain of the PMOS transistor 212 is $V_{SDP1}$, a voltage between a source and a gate of the PMOS transistor 212 is $V_{SGP1}$, a voltage between a source and a drain of the PMOS transistor 214 is $V_{SDP2}$, a voltage between a source and a gate of the PMOS transistor 214 is $V_{SGP2}$ as parameters, then the operations of the PMOS transistors 212, 214 of the sense amplifier circuit 210 in the saturation region can be realized by satisfying the following formula (6) for the PMOS transistor 212 and the following formula (7) for the PMOS transistor 214 respectively:

$$V_{SDP1} > Vcc - V_{BIASP} - |V_{TP}| \qquad (6)$$

$$V_{SDP2} > V_{SGP2} - |V_{TP}| \qquad (7).$$

From the formulae (6), (7), the following formula (8) is obtained:

$$V_{SDP1} + V_{SGP2} > Vcc - V_{BIASP} - |V_{TP}| + V_{SGP2} - |V_{TP}| \qquad (8).$$

In addition, the PMOS transistor 212, 214 is connected in series between the power supply Vcc and the input terminal BL (i.e., bit line BLn) and the voltage of the bit line BLn is maintained at the reference voltage $V_{BLREF}$. Therefore, the next formula (9) is established:

$$Vcc - V_{BLREF} = V_{SDP1} + V_{SDP2} \qquad (9).$$

From the formulae (8), (9), the following formula (10) is obtained:

$$V_{BLREF} < V_{BIASP} + 2|V_{TP}| - V_{SGP2} \qquad (10)$$

Accordingly, if the formula (10) is satisfied in the sense amplifier circuit 210, then the PMOS transistors 212, 214 operate in the saturation regions. Such operations can be realized normally by adjusting the bias voltage $V_{BIASP}$ etc. However, it is difficult to satisfy the formula (5), similarly to the sense amplifier circuit 200, if the power supply Vcc is a relatively low voltage and the reference voltage $V_{BLREF}$ is a relatively high voltage. As a result, the PMOS transistors 212, 214 do not operate in the saturation region, so that fatal inconveniences such as the gain reduction etc. occurs and the voltage at the bit line BL is not kept at the reference voltage $V_{BLREF}$ or the like.

SUMMARY OF THE INVENTION

The present invention has been made under taking the facts into consideration, and an object of the present invention is to provide a data readout circuit and a semiconductor memory device capable of reading data out from the memory cell while the voltage of the input terminal is kept at the reference voltage without gain reduction even under the condition that the voltage of the power supply is in a lower level, alternatively the reference voltage of the input terminal is in a higher level.

In order to achieve the above described object, a data readout circuit according to a 1st aspect of the present invention comprises:

a 1st PMOS transistor configured to operate in a saturation region and including a source connected to a power supply, a drain connected to an input terminal connected to a memory cell of a data readout object, and a gate to which a 1st bias voltage is supplied;

a 2nd PMOS transistor including a source connected to the drain of said 1st PMOS transistor, a drain connected to an output terminal, and a gate to which a 2nd bias voltage is supplied;

a 1st NMOS transistor including a drain connected to the drain of said 2nd PMOS transistor, a source grounded, and a gate to which a 3rd bias voltage is supplied; and a bias voltage supply section causing said 2nd PMOS transistor to operate in a saturation region and supplying the 2nd bias voltage to the gate of the 2nd PMOS transistor, wherein the 2nd bias voltage is adjusted so as to keep a reference voltage of said input terminal at a junction point between the drain of said 1st PMOS transistor and the source of said 2nd PMOS transistor.

According to a 2nd aspect of the present invention, in the data readout circuit according to the 1st aspect, said bias voltage supply section comprises:

a 3rd PMOS transistor including a source to which the reference voltage $V_{BLREF}$ of said input terminal is supplied, a gate connected to the gate of said 2nd PMOS transistor, and a drain short-circuited to the gate; and a constant current supply connected to the drain of said 3rd PMOS transistor, wherein said 2nd PMOS transistor and said 3rd PMOS transistor form a Current mirror circuit, wherein when supplying the 2nd bias voltage to the gate of the 2nd PMOS transistor then the 2nd bias voltage $V_{BLREF}$ represented by an inequality below is satisfied, $$V_{BLREF} < V_{BIASP} + |V_{TP}|$$

where $V_{TP}$ denotes a threshold voltage of said 1st PMOS transistor and $V_{BIASP}$ denotes said 1st bias voltage.

A data readout circuit according to a 3rd aspect of the present invention comprises:

a 1st PMOS transistor configured to operate in a linear region and including a source connected to a power supply, and a gate to which a 1st bias voltage is supplied;

a 2nd PMOS transistor configured to operate in a saturation region and including a source connected to the drain of said 1st PMOS transistor, a gate to which a 2nd bias voltage is supplied, and a drain connected to an output terminal;

a 1st NMOS transistor configured to operate in a saturation region and including a drain connected to the drain of said 2nd PMOS transistor, a source grounded, and a gate to which a 3rd bias voltage is supplied;

a 4th PMOS transistor including a source connected to the drain of said 1st PMOS transistor, and a drain connected to an input terminal connected to a memory cell of a data readout object; and a differential amplifier section to which the reference voltage of said input terminal is inputted and connected to said 4th PMOS transistor so that the reference voltage of said input terminal is maintained at the drain of said 4th PMOS transistor.

A data readout circuit according to a 4th aspect of the present invention comprises:

a 1st PMOS transistor configured to operate in a linear region and including a source connected to a power supply, and a gate to which the 1st bias voltage is supplied;

a 2nd PMOS transistor configured to operate in a saturation region and including a source connected to the drain of said 1st PMOS transistor, a gate to which a 2nd bias voltage is supplied, and a drain connected to an output terminal;

a 1st NMOS transistor configured to operate in a saturation region and including a drain connected to the drain of said 2nd PMOS transistor, a source grounded, and a gate to which a 3rd bias voltage is supplied; and a 2nd NMOS transistor including a drain connected to the drain of said 1st PMOS transistor, and a source connected to an input terminal connected to a memory cell of a data readout object;

a differential amplifier section to which the reference voltage of said input terminal is inputted and connected to said 2nd NMOS transistor so that the reference voltage of said input terminal is maintained at the source of said 2nd NMOS transistor.

According to a 5th aspect of the present invention, in the data readout circuit according to the 3rd or 4th aspect, said 1st bias voltage is supplied to said 1st PMOS transistor so that an inequality represented below is satisfied, $$V_{BLA} > V_{BIASP} + |V_{TP}|$$

where $V_{TP}$ denotes a threshold voltage of said 1st PMOS transistor, $V_{BIASP}$ denotes said 1st bias voltage, and $V_{BLA}$ denotes a voltage at the node BLA connected to the drain of said 1st PMOS transistor and the source of said 2nd PMOS transistor.

According to a 6th aspect of the present invention, in the data readout circuit according to the 3rd, 4th or 5th aspect, the gate of said 1st PMOS transistor is connected to said output terminal.

According to a 7th aspect of the present invention, in the data readout circuit according to the 3rd, 4th or 5th aspect, the gates of said 1st PMOS transistor and said 2nd PMOS transistor are connected to said output terminal.

A semiconductor memory device according to an 8th aspect of the present invention comprises:

a memory cell array comprised of a plurality of memory cells capable of storage of data;

a comparator circuit for comparing a 1st voltage inputted into a 1st input terminal with a 2nd voltage inputted into the 2nd input terminal to output a comparison result;

a data reading section including the data readout circuit of any one of the 1st to 6th aspects, wherein said input terminal is connected to the memory cell of the data readout object, and said output terminal is connected to said 1st input terminal of said comparator circuit; and a reference voltage supply section including the data readout circuit of any one of the 1st to 6th aspects, wherein said output terminal is connected to said 2nd input terminal of said comparator circuit.

A semiconductor memory device according to a 9th aspect of the present invention comprises:

a memory cell array comprised of a plurality of memory cells capable of storage of data;

a comparator circuit for comparing a 1st voltage inputted into a 1st input terminal with a 2nd voltage inputted into the 2nd input terminal to output a comparison result;

a data reading section including the data readout circuit of any one of the 3rd to 6th aspects, wherein said input terminal is connected to the memory cell of the data readout object, and said output terminal is connected to said 1st input terminal of said comparator circuit; and a reference voltage supply section including the data readout circuit of the 7th aspect, wherein said output terminal is connected to said 2nd input terminal of said comparator circuit and the gate of said 2nd PMOS transistor respectively.

According to the present invention of the data readout circuit and the semiconductor memory device, there is obtained an excellent advantageous effect of realizing the readout of data from the memory cell while the voltage of the input terminal is kept at the reference voltage without gain reduction even under the condition that the voltage of the power supply is in a lower level, alternatively the reference voltage of the input terminal is in a higher level.

BRIEF DESCRIPTION OF DRAWINGS

The aforementioned aspects and other features of the invention are explained in the following description, taken in connection with the accompanying drawing figures wherein:

FIG. 12 is a circuit diagram showing a sense amplifier circuit relative to the 5th embodiment;

DETAILED DESCRIPTION OF THE INVENTION

Concretely with reference with the drawings, embodiments of the present invention will now will described below.
[First Embodiment]

Figure 3:
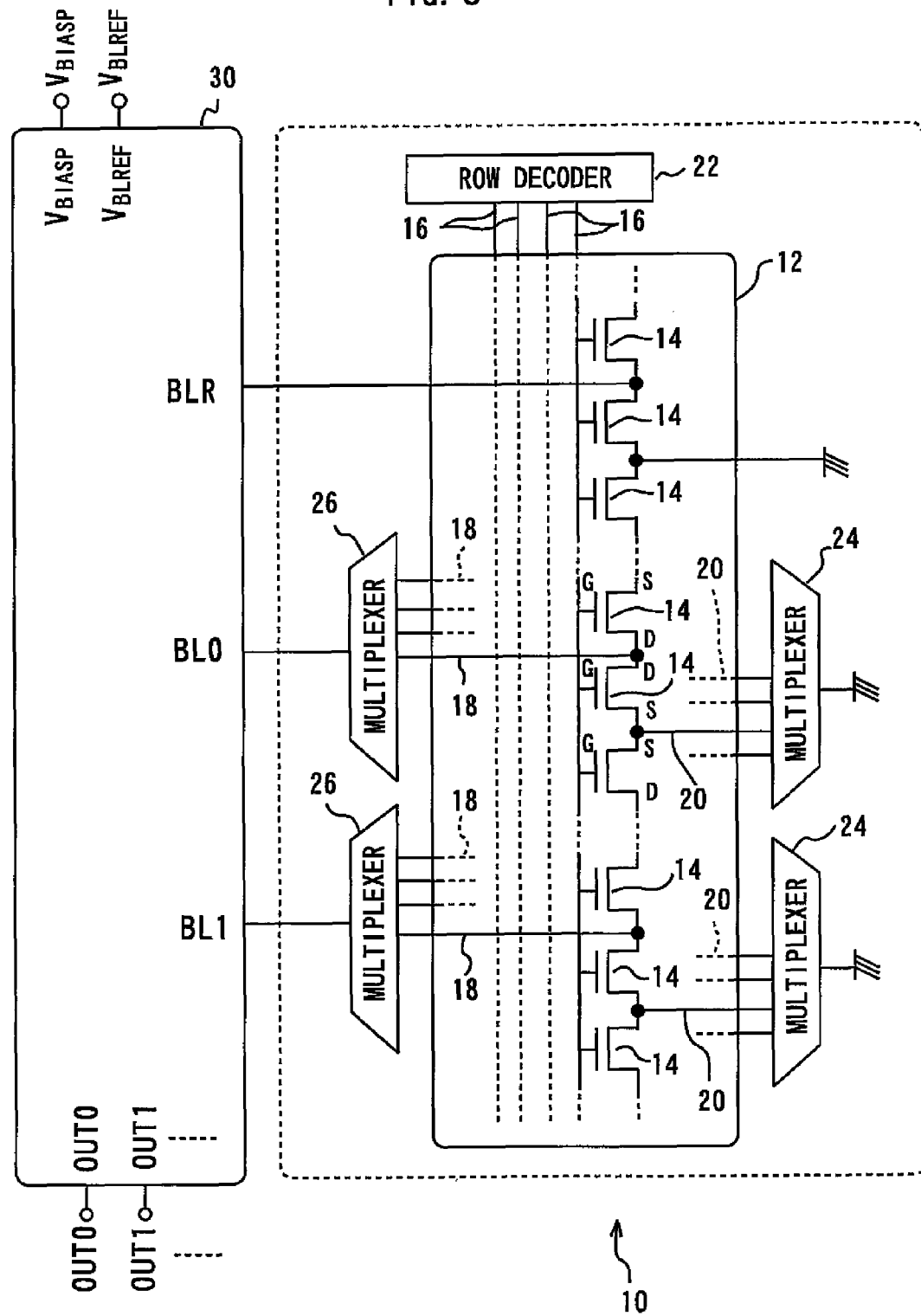
FIG. 3 is a circuit diagram showing a MOS type semiconductor memory device relative to the present embodiment.

FIG. 3 shows a MOS (Metal Oxide Semiconductor) type semiconductor memory device 10 according to the present embodiment. The MOS type semiconductor memory device 10 has a memory cell array 12 comprising: a plurality of memory cells 14 arranged in a matrix; a plurality of word lines 16 each arranged so as to extends in the row direction of the memory cells 14; and a plurality of bit lines 18 and the source lines 20 each arranged so as to extends in the column direction of the memory cells 14.

In FIG. 3, "D" denotes a drain, "S" denotes a source and "G" denotes a gate in only one portion of the memory cells 14. As apparent from this notation, the individual memory cells 14 are arranged in the row direction in which a pair of neighboring memory cells 14 are connected to each another at the drains thereof, and the next pair of neighboring memory cells 14 are connected to each another at the sources thereof. The nodes each connecting the neighboring drains of the memory cells 14 are connected to plural bit lines 18 respectively, and the nodes each connecting the neighboring sources of the memory cells 14 are connected to plural source lines 20 respectively. Also, as shown in FIG. 3, the gates of the individual memory cells 14 connected to every word line 16 so that the gates of a plurality of memory cells 14 arranged in the row direction are connected to the same one of the word lines 16.

The plurality of word lines 16 provided in the memory cell array 12 are connected to the row decoder 22. The row address of the memory cell of the data readout object 14 is inputted into the row decoder 22 at the time of data readout from the memory cell array 12, and then the row decoder 22 supplies a selection voltage to the single word line 16 corresponding to the row address within the plurality of word lines 16. In addition, the plurality of source lines 20 provided in the memory cell array 12 are connected to the input terminal of some of a plurality of multiplexers 24. Each multiplexer 24 has an output terminal connected to a ground terminal, and the multiplexer 24 operates so that the source line 20, connected to a source of the memory cell of the data readout object 14, is connected to the ground terminal according to a selection signal inputted from the outside at the time of data readout from the memory cell array 12. In addition, the plurality of bit lines 18 provided in the memory cell array 12 are connected to the input terminal of some of a plurality of multiplexers 26. Each multiplexer 26 has an output terminal connected to a bit line junction terminal BLn of the amplifier block circuit 30, and the multiplexer 26 operates so that the bit line 18, connected to a drain of the memory cell of the data readout object 14, is connected to the bit line junction terminal BLn of the amplifier block circuit 30 according to a selection signal inputted from the outside at the time of data readout from the memory cell array 12.

The amplifier block circuit 30, described in detail later, supplies a constant voltage to the bit line 18 connected to the bit line junction terminal BLn at the time of data readout from the memory cell array 12. Accordingly, when performing the data readout from the memory cell array 12, a selection voltage (e.g., about 5V) is supplied to the gate and the source is grounded in potential (e.g., 0V) and a constant voltage (e.g., about 1.2V) is supplied to the drain in the memory cell of the data readout object, resulting in flowing a current between the drain and the source of the memory cell of the data readout object 14 (a so-called outflow current $I_{BL}$ described below).

The amount of the current changes in response whether or not excess electrons exist in a Floating Gate of the memory cell of the data readout object 14. The amount of flowing current in case excess electrons do not exist in the Floating Gate (namely the readout objective data stored in the memory cell of the data readout object 14 is "1") is greater than that of excess electrons exist (namely the readout objective data stored in the memory cell of the data readout object 14 is "1"). Therefore, the amplifier block circuit 30 may judge "0" or "1" of the readout objective data stored in the memory cell of the data readout object 14 in the basis of the amount of current flowing through the bit line 18 connected to the bit line junction terminal BLn (i.e., outflow current $I_{BL}$) at the time of data readout from the memory cell array 12.

Figure 1A:
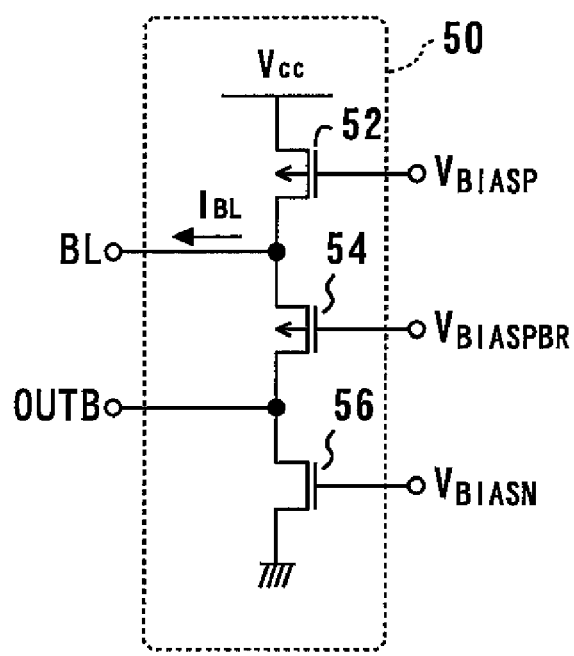
FIGS. 1A and 1B are circuit diagrams each showing a sense amplifier circuit relative to the 1st embodiment.

Next, the sense amplifier circuit 50 and the voltage generator circuit 36 constituting the amplifier block circuit 30 will now will described prior to the amplifier block circuit 30. The sense amplifier circuit 50 relative to the present 1st embodiment is a current source type sense amplifier circuit. As shown in FIG. 1A the sense amplifier circuit 50 includes a PMOS transistor 52 having a source connected to the power supply Vcc, a gate connected to the 1st bias voltage input terminal, and a drain connected to the input terminal BL. The bias voltage $V_{BIASP}$ is supplied to the gate of the PMOS transistor 52 via the 1st bias voltage input terminal. Besides in the present 1st embodiment, the amount of the bias voltage $V_{BIASP}$ and the characteristics of the PMOS transistor 52 are adjusted so as to the PMOS transistor 52 operates in a saturation region.

In addition, a drain of the PMOS transistor 52 is connected to a source of the PMOS transistor 54. The PMOS transistor 54 has a gate connected to the 2nd bias voltage input terminal, a drain connected to the output terminal OUTB. The bias voltage $V_{BIASPBR}$ is supplied to the gate of the PMOS transistor 54 via the 2nd bias voltage input terminal. In the present 1st embodiment, the PMOS transistor 54 operates in a saturation region, as well as the source-drain current $I_{SD}$ Of the PMOS transistor 54 is determined by the following equation (11), $$I_{SD}=K(V_{SGP}-|V_{TP}|)2 \qquad (11)$$

where $V_{SGP}$ denotes a voltage between a source and a drain the PMOS transistor 54, $V_{TP}$ denotes a threshold voltage of the PMOS transistor 54, and K denotes the transconductance coefficient, wherein the amount of the bias voltage $V_{BIASPBR}$ and the characteristic of the PMOS transistor 54 are adjusted so that the value of the transconductance coefficient K is the predetermined value or more.

In addition, a drain of the PMOS transistor 54 is connected to a drain of the NMOS transistor 56, and the NMOS transistor 56 has a gate connected to the 3rd bias voltage input terminal and a source connected to the ground terminal. The bias voltage $V_{BIASN}$ is supplied to a gate of the NMOS transistor 56 via the 3rd bias voltage input terminal. In the present 1st embodiment, the amount of the bias voltage $V_{BIASN}$ and the characteristic of the NMOS transistor 56 are adjusted so that the NMOS transistor 56 operates in a linear region.

Figure 1B:
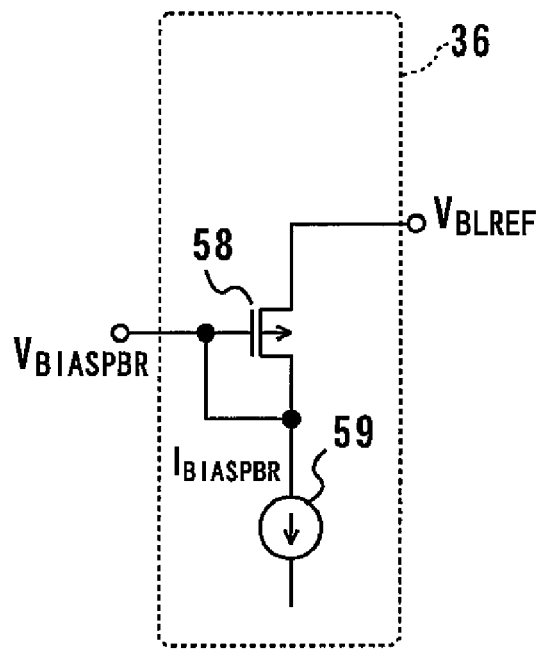

Also, as shown in FIG. 1B, the voltage generator circuit 36 relative to the present 1st embodiment includes the PMOS transistor 58 having a source connected to the reference voltage input terminal. This PMOS transistor 58 has a gate connected to the bias voltage output terminal, and a drain connected to the gate and the constant current supply 59 generating a constant current $I_{BIASPBR}$.

Figure 2:
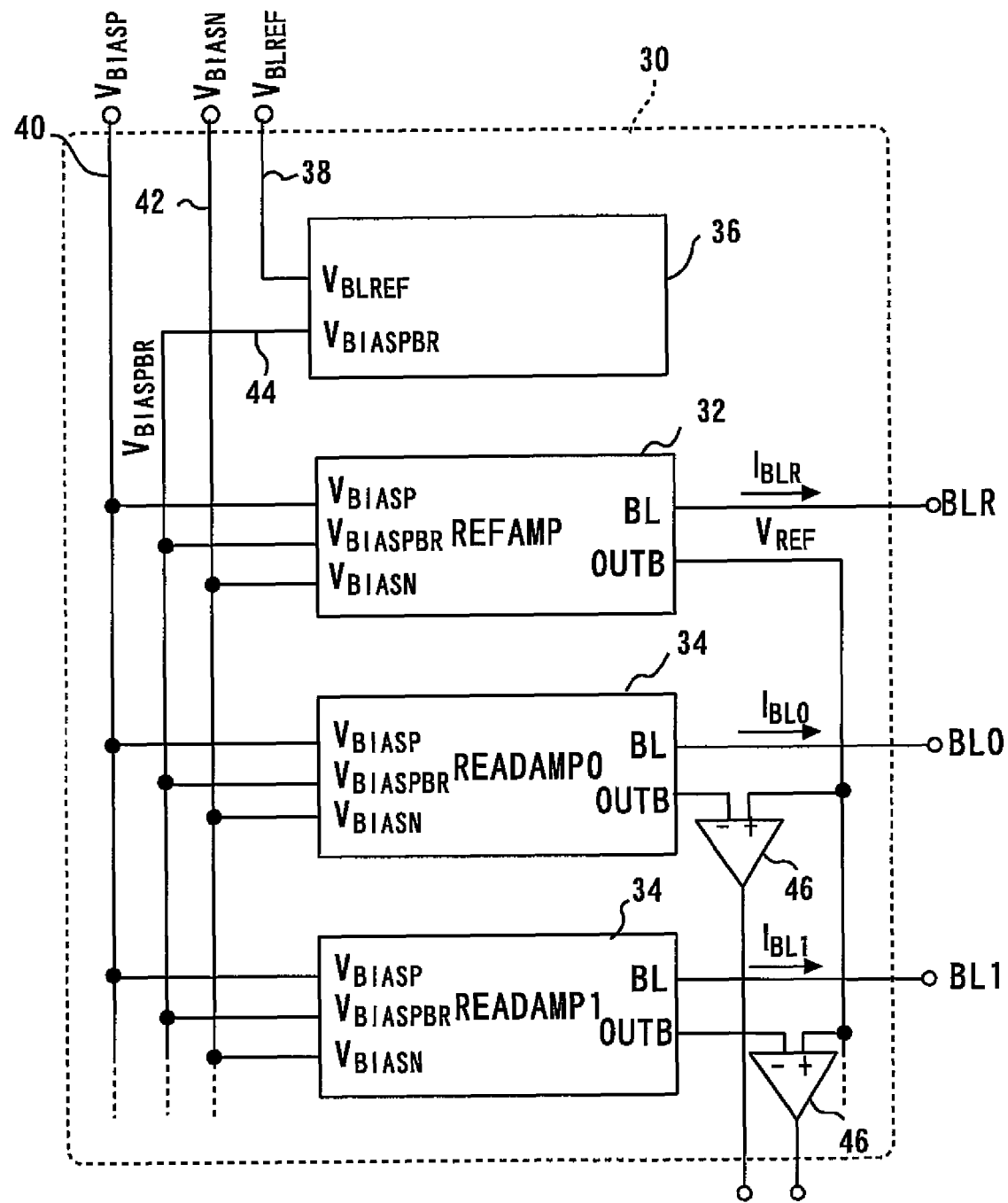
FIG. 2 is a schematic block diagram showing an amplifier block circuit relative to the 1st embodiment.

As shown in FIG. 2, the amplifier block circuit 30 relative to the present 1st embodiment includes the single reference sense amplifier circuit 32, and a plurality of readout sense amplifier circuits 34 each of which is comprised of the sense amplifier circuit 50, as well as the voltage generator circuit 36. The reference voltage input terminal of the voltage generator circuit 36 is connected to the reference voltage supply line 38. The reference voltage $V_{BLREF}$ is supplied to the voltage generator circuit 36 from an external circuit (not shown) via the reference voltage supply line 38.

In addition, the 1st bias voltage input terminals of the reference sense amplifier circuit 32 and the readout sense amplifier circuits 34 are connected to the 1st bias voltage supply line 40, the bias voltage $V_{BIASP}$ are supplied to the circuits 32 and 34 from an external circuit (not shown) via the 1st bias voltage supply line 40. This bias voltage $V_{BIASP}$ is supplied to a gate of the PMOS transistor 52 in the sense amplifier circuit 50 that constitutes the reference sense amplifier circuit 32 and the readout sense amplifier circuits 34.
In addition, the 3rd bias voltage input terminals of the reference sense amplifier circuit 32 and the readout sense amplifier circuits 34 are connected to the 3rd bias voltage supply line 42, the bias voltage $V_{BIASN}$ are supplied to the circuits 32 and 34 from an external circuit (not shown) via the 3rd bias voltage supply line 42. This bias voltage $V_{BIASN}$ is supplied to a gate of the NMOS transistor 56 in the sense amplifier circuit 50 that constitutes the reference sense amplifier circuit 32 and the readout sense amplifier circuits 34.

In addition, the 2nd bias voltage input terminals of the reference sense amplifier circuit 32 and the readout sense amplifier circuits 34 are connected to the 2nd bias voltage supply line 44. This 2nd bias voltage supply line 44 is connected to the bias voltage output terminal of the voltage generator circuit 36. The bias voltage $V_{BIASPBR}$ are supplied to the 2nd bias voltage input terminals of the reference sense amplifier circuit 32 and the readout sense amplifier circuits 34 from the voltage generator circuit 36 via the 2nd bias voltage supply line 44. This bias voltage $V_{BIASPBR}$ is supplied to a gate of the PMOS transistor 54 in the sense amplifier circuit 50 that constitutes the reference sense amplifier circuit 32 and the readout sense amplifier circuits 34.

In addition, the input terminals BL of the readout sense amplifier circuits 34 are connected to the output terminals of some of a plurality of multiplexers 26 which are different from each other. Accordingly, the outflow current $I_{BLn}$ flows through the input terminal BL of each readout sense amplifier circuit 34 at the time of data readout from the memory cell array 12, in which the outflow current $I_{BLn}$ has an amount according to the value ("0" or "1") of the readout objective data stored in the memory cell of the data readout object 14 connected to the readout sense amplifier circuit 34 via the multiplexer 26. Whereas the input terminal BL of the reference sense amplifier circuit 32 is fixedly connected to a specific drain of the memory cell 14 of the memory cell array 12, as shown in FIG. 3. This specific memory cell 14 has a source grounded and, a constant outflow current (reference outflow current $I_{BLR}$) flows at the input terminal BL of the reference sense amplifier circuit 32 at the time of data readout from the memory cell array 12.

Further, in the amplifier block circuit 30 has the operational amplifiers 46 in the same number of the operational amplifiers 46 as the readout sense amplifier circuits 34, the output terminals OUTB of the readout sense amplifier circuits 34 are connected to the inversion input terminals of some of the operational amplifiers 46 which are different from each other. In addition, the output terminal OUTB of the reference sense amplifier circuit 32 is connected to the non-inversion input terminals of the operational amplifiers 46 and, the reference voltage $V_{REF}$ outputted from the output terminal OUTB of the reference sense amplifier circuit 32 is supplied to the non-inversion input terminals of the operational amplifiers 46.

Besides the sense amplifier circuit 50 and the voltage generator circuit 36 correspond to the foregoing 1st aspect of the data readout circuit, in detailed, the PMOS transistor 52 of the sense amplifier circuit 50 corresponds to the foregoing 1st aspect of the 1st PMOS transistor, and the PMOS transistor 54 corresponds to the foregoing 1st aspect of the 2nd PMOS transistor, and the NMOS transistor 56 corresponds to the foregoing 1st aspect of the 1st NMOS transistor, and the voltage generator circuit 36 corresponds to the bias voltage supply section of the foregoing 1st aspect (specifically the foregoing 2nd aspect). In addition, the bias voltage $V_{BIASP}$ supplied to a gate of the PMOS transistor 52 corresponds to the foregoing 1st aspect of the 1st bias voltage, and the bias voltage $V_{BIASPBR}$ supplied to a gate of the PMOS transistor 54 corresponds to the foregoing 1st aspect of the 2nd bias voltage, and the bias voltage $V_{BIASN}$ supplied to a gate of the NMOS transistor 56 corresponds to the foregoing 1st aspect of the 3rd bias voltage. Further, the PMOS transistor 58 of the voltage generator circuit 36 corresponds to the 3rd PMOS transistor of the foregoing 2nd aspect, and the constant current supply 59 corresponds to the constant current supply of the foregoing 2nd aspect.

In addition, the MOS type semiconductor memory device 10 including the amplifier block circuit 30 relative to the present 1st embodiment corresponds to the semiconductor memory device of the foregoing 8th aspect. The memory cell array 12 corresponds to the memory cell array of the foregoing 8th aspect, and the operational amplifier 46 corresponds to the comparator circuit of the foregoing 8th aspect, and the readout sense amplifier circuit 34 composed of the sense amplifier circuit 50 corresponds to the data reading section of the foregoing 8th aspect, and the reference sense amplifier circuit 32 composed of the sense amplifier circuit 50 corresponds to the reference voltage supply section of the foregoing 8th aspect.

Next, operations of the sense amplifier circuit 50 and the voltage generator circuit 36 at the time of data readout from the memory cell array 12 will now will described as an effect of the present 1st embodiment. Since the individual sense amplifier circuit 50, which constitutes each of the reference sense amplifier circuit 32 and the readout sense amplifier circuits 34, has the input terminal BL connected to a drain of the memory cell 14, in order to read data out from the memory cell 14, it is necessary to supply the reference voltage $V_{BLREF}$ to a drain of the memory cell 14 connected to the individual sense amplifier circuit 50, while keeping the reference voltage $V_{BLREF}$ at the input terminal BL of the individual sense amplifier circuit 50. For this, in the present 1st embodiment, when the outflow current $I_{BLn}=0$ in the individual sense amplifier circuit 50, the amount of a constant current $I_{BIASPBR}$ generated by the constant current supply 59 of the voltage generator circuit 36 and the characteristic of the PMOS transistor 58 in the voltage generator circuit 36 are adjusted so that the PMOS transistor 58 of the voltage generator circuit 36 and the PMOS transistor 54 of the individual sense amplifier circuit 50 form a Current Mirror. By this configuration, the PMOS transistor 58 in the voltage generator circuit 36 and the PMOS transistor 54 in the individual sense amplifier circuit 50 form a Current Mirror, as a result, when the outflow current $I_{BLn}=0$ in the individual sense amplifier circuit 50 then the voltage at the input terminal BL is equal to the reference voltage $V_{BLREF}$.

Figure 4A:
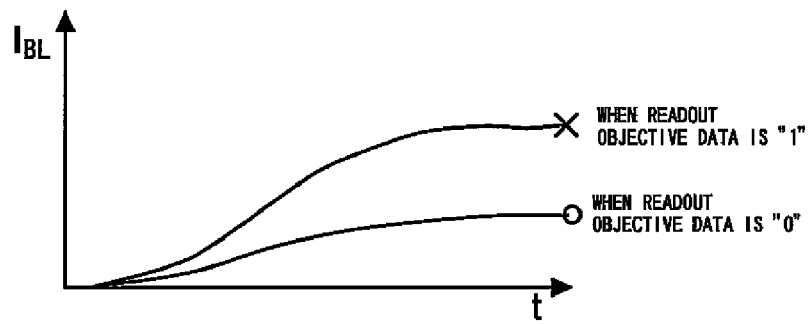
FIGS. 4A and 4B are graph diagrams each showing various changes of voltage at the time of data readout in the 1st embodiment.
Figure 4B:
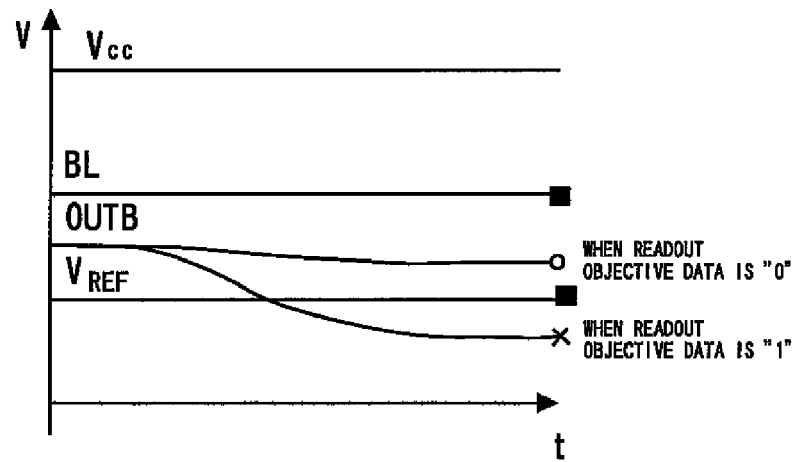

Thus it starts to read the readout objective data from the memory cell of the data readout object 14, and the outflow current $I_{BL}$ flows into the input terminal BL of the readout sense amplifier circuit 34 (consisted of the individual sense amplifier circuit 50), and the voltage at the input terminal BL of the readout sense amplifier circuit 34 has a voltage slightly decreased from the reference voltage $V_{BLREF}$ as shown in FIG. 4B at a notation "BL", for example. Thus there is a very small amount of reduction at the input terminal BL of the readout sense amplifier circuit 34 caused even by the outflow current $I_{BL}$, because the PMOS transistor 54 has a transconductance coefficient "K" greater than the predetermined value. Since the PMOS transistor 52 works in the saturation region, the source-drain current $I_{SDP}$ of the PMOS transistor 52 does not change even if the voltage at the input terminal BL slightly decreases.

Whereas, since the transconductance coefficient K of the PMOS transistor 54 is greater than the predetermined value, the outflow current $I_{BL}$ flows and then the voltage at the input terminal BL is slightly reduced from the reference voltage $V_{BLREF}$, so that the source-drain current $I_{SDP}$ of the PMOS transistor 54 is reduced by the amount of the outflow current $I_{BL}$. In addition, the drain-source current $I_{DSN}$ of the NMOS transistor 56 is also reduced by the amount of the outflow current $I_{BL}$, and the output voltage of the output terminal OUTB decreases. Accordingly, the amount of reduction of the output voltage at the output terminal OUTB changes in response to the amount of the outflow current $I_{BL}$. Thus, as shown in FIG. 4A, when the readout objective data is "1" then the outflow current $I_{BL}$ is greater than that of the case the readout objective data is logs. Therefore the source-drain current $I_{SDP}$ in the PMOS transistor 54 and the drain-source current $I_{DSN}$ in the NMOS transistor 56 are different in the reduction amount thereof from each other in response to the readout objective data "1" or "0", so that the amount of reduction of the output voltage at the output terminal OUTB clearly changes in response to the readout objective data "1" or "0".

The reference sense amplifier circuit 32 of the amplifier block circuit 30 is configured so that, for example as shown in FIG. 4B, the output voltage of the output terminal OUTB (i.e., the reference voltage $V_{REF}$ supplied to each operational amplifier 46) is determined to be equal to the middle voltage both of the output voltage after decreased correspondingly to the amount of the outflow current $I_{BL}$ when the readout objective data is "0" and the output voltage after decreased correspondingly to the amount of the outflow current $I_{BL}$ when the readout objective data is "1".

As described above, the determination the reference voltage $V_{REF}$ to be equal to the said middle voltage can be realized by adjusting electrons in the Floating Gate of the specific memory cell 14 connected to the reference sense amplifier circuit 32 in such a manner that, for example, the reference outflow current $I_{BLR}$ flowing through the input terminal BL of the reference sense amplifier circuit 32, becomes equal to the middle amount both of the outflow current $I_{BL}$ when the readout objective data is "1" and the outflow current $I_{BL}$ when the readout objective data is "0". By this, the readout objective data "0" or "1" may be discriminated on the basis of output from each operational amplifier 46 operating as a differential amplifier.

Next, conditions in operations of the sense amplifier circuit 50 relative to the present 1st embodiment will now be described. In directing the attention to the PMOS transistor 54, the inventors find conditions of the bias voltage $V_{BIASP}$ to make the PMOS transistor 52 operate in a saturation region. Providing the threshold voltage of the PMOS transistor 52 is $V_{TP}$, there is obtained the following numerical formula:

$$V_{BLREF} < V_{BIASP} + |V_{TP}| \qquad (12).$$

Thus, the bias voltage $V_{BIASP}$ etc. supplied to the sense amplifier circuit 50 is adjusted so that the formula (12) is satisfied in the present 1st embodiment. It is necessary that the preceding formula (5) or (10) is satisfied in order that the operation of a MOS transistor is allowed in a saturation region by the sense amplifier circuit shown in FIG. 15. However, in the sense amplifier circuit 50 relative to the present 1st embodiment, the operation of the PMOS transistor 54 (and the PMOS transistor 52) is realized in a saturation even in satisfying the said formula (12), so that the voltage at the input terminal BL is kept at the reference voltage $V_{BLREF}$ and, the discrimination of the readout objective data "0" or "1" is performed on the basis of the output voltage changing in response to the outflow current $I_{BL}$.

Figure 15A:
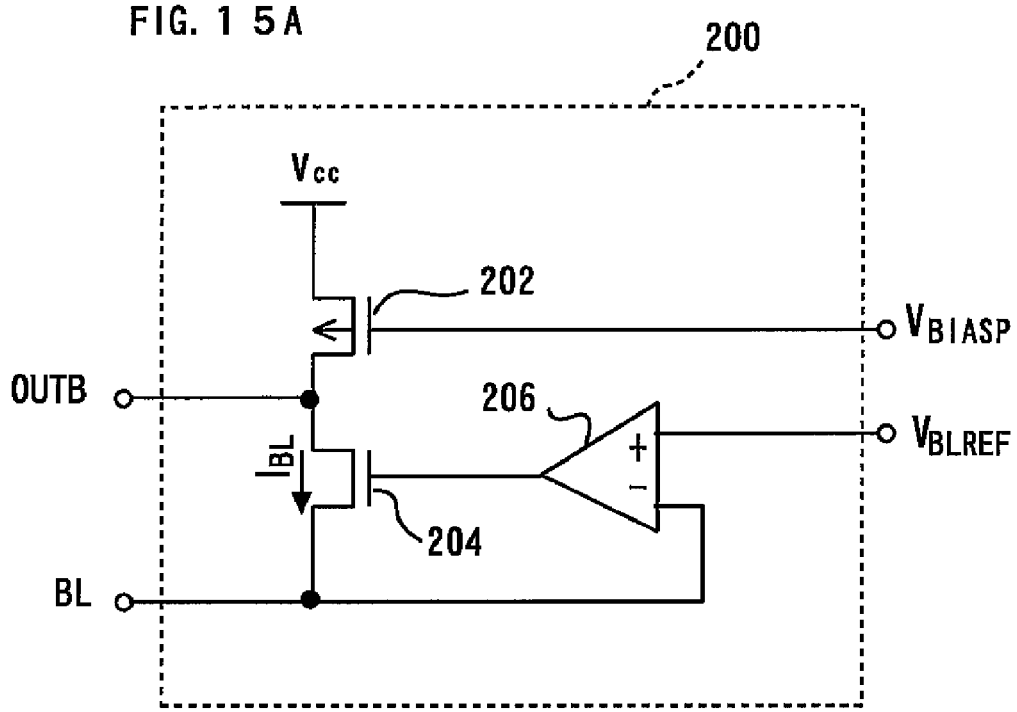
FIGS. 15A and 15B are circuit diagrams each showing a conventional sense amplifier circuit.
Figure 15B:
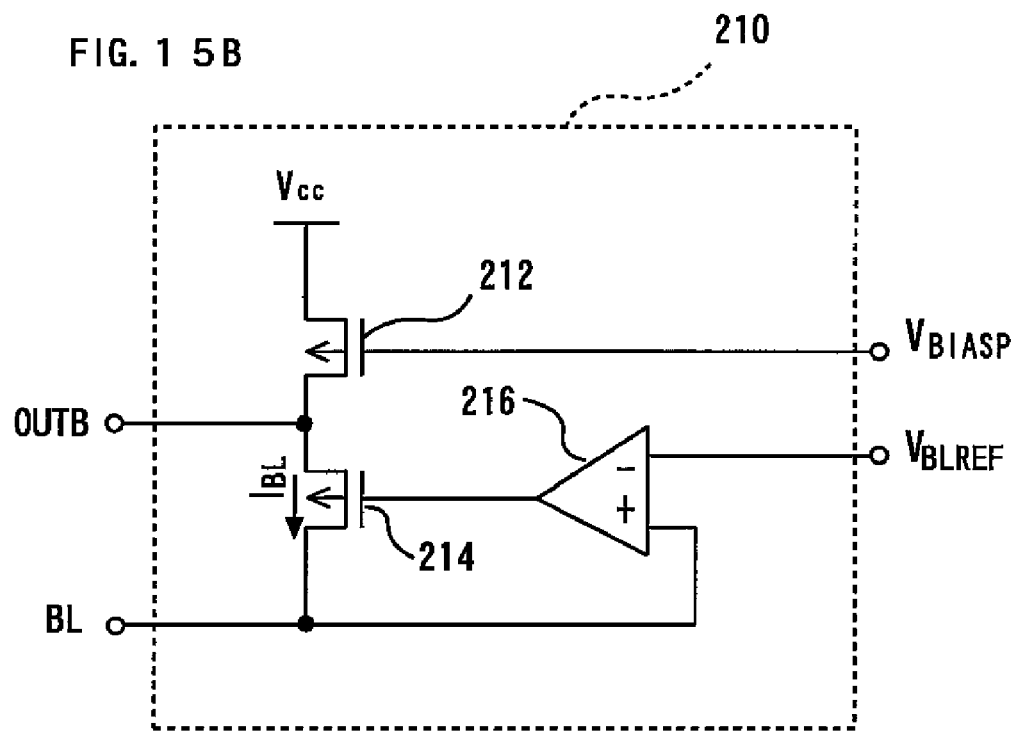
Figure 16:
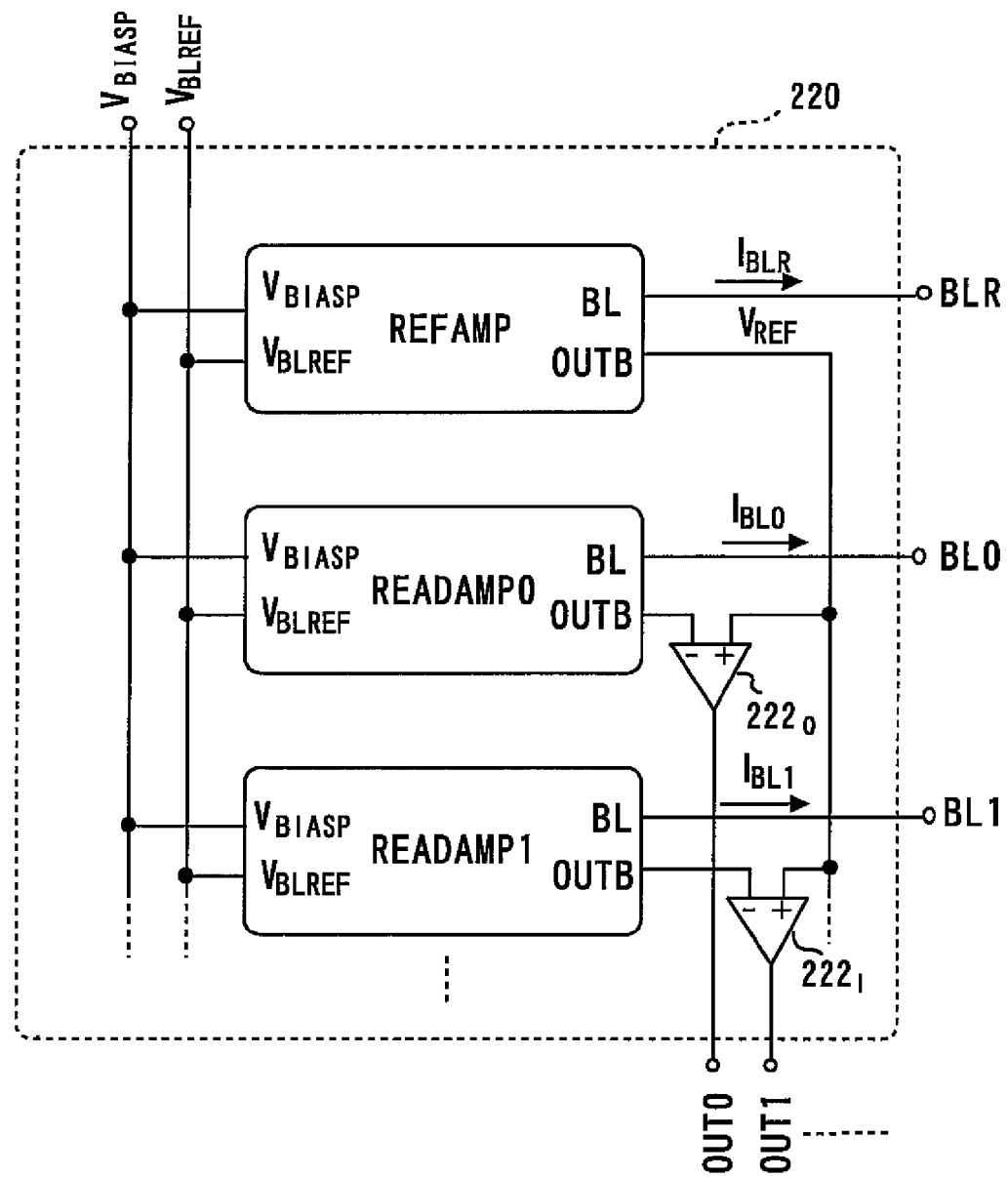
FIG. 16 is a schematic block diagram showing an amplifier block circuit using a conventional sense amplifier circuit.
Figure 17A:
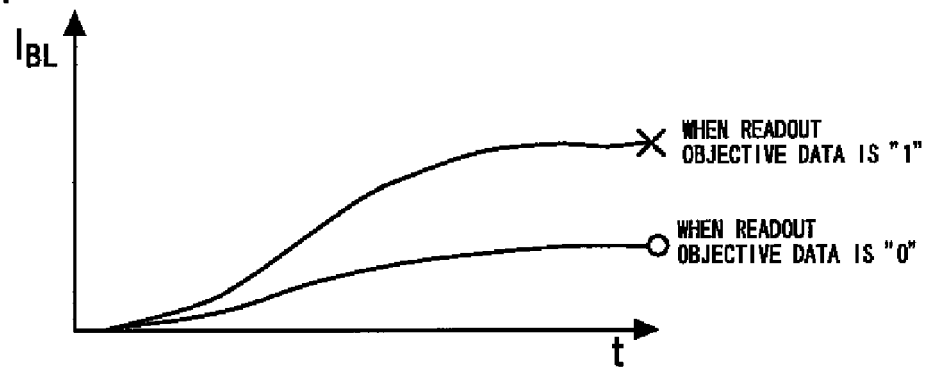
FIGS. 17A and 17B are graph diagrams each showing of various changes of voltage at the time of data readout in a conventional sense amplifier circuit.
Figure 17B:
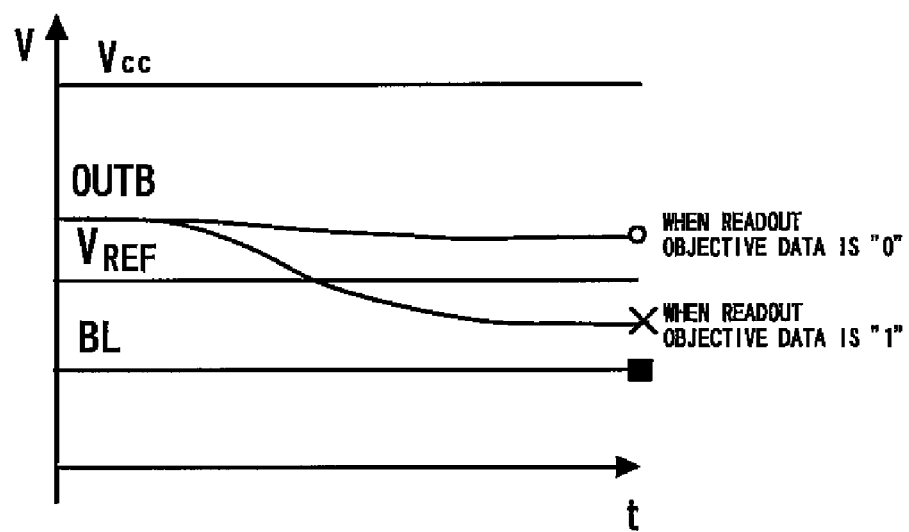

It is obvious in comparison with formulae (12) and (5) that the sense amplifier circuit 50 relative to the present 1st embodiment realizes to relax conditions on the bias voltage $V_{BIASP}$ by "$V_{GSN}-V_{TN}$" as comparing with the sense amplifier circuit 200 shown in FIG. 15A. In addition, it is obvious in comparison with formulae (12) and (10) that the sense amplifier circuit 50 relative to the present 1st embodiment realizes to relax conditions on the bias voltage $V_{BIASP}$ by "$V_{SGP}-|V_{TP}|$" as comparing with the sense amplifier circuit 210 shown in FIG. 15B. Accordingly, the sense amplifier circuit 50 relative to the present 1st embodiment can maintain the voltage at the input terminal BL at $V_{BLREF}$ by the operations of the PMOS transistors 52, 54 in the linear region while preventing the gain reduction even if the voltage reductions "$V_{GSN}-V_{TN}$", "$V_{SGP}-|V_{TP}|$" of the power supply Vcc occur and the reference voltage $V_{BLREF}$ increases in comparison with the conventional sense amplifier circuits 200, 210.

[Second Embodiment]

Next, the 2nd embodiment of the present invention will now will described. In this embodiment, the same structures and portions as those in the 1st embodiment are indicated by the same reference numerals, so description of the same structures will be omitted hereafter.

Figure 5:
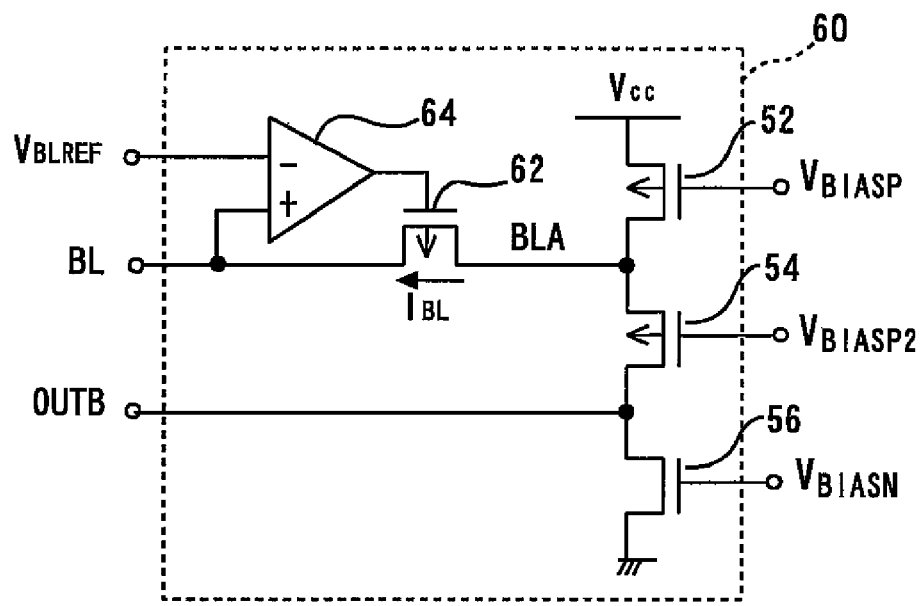
FIG. 5 is a circuit diagram showing a sense amplifier circuit relative to the 2nd embodiment.

As shown in FIG. 5, in the sense amplifier circuit 60 relative to the present 2nd embodiment, the PMOS transistor 62 and the operational amplifier 64 are added to the sense amplifier circuit 50 described in the 1st embodiment. The PMOS transistor 62 is provided between a drain of the PMOS transistor 52 (i.e., a source of the PMOS transistor 54) and the input terminal BL and the PMOS transistor 62 has a source connected to a drain of the PMOS transistor 52 (i.e., a source of the PMOS transistor 54)(this junction point is called as a node BLA hereinafter) and a drain connected to the input terminal BL. In addition, the operational amplifier 64 has an inversion input terminal connected to the reference voltage input terminal to which the reference voltage $V_{BLREF}$ is supplied, a non-inversion input terminal connected to the input terminal BL, and an output terminal connected to a gate of the PMOS transistor 62.

Figure 6:
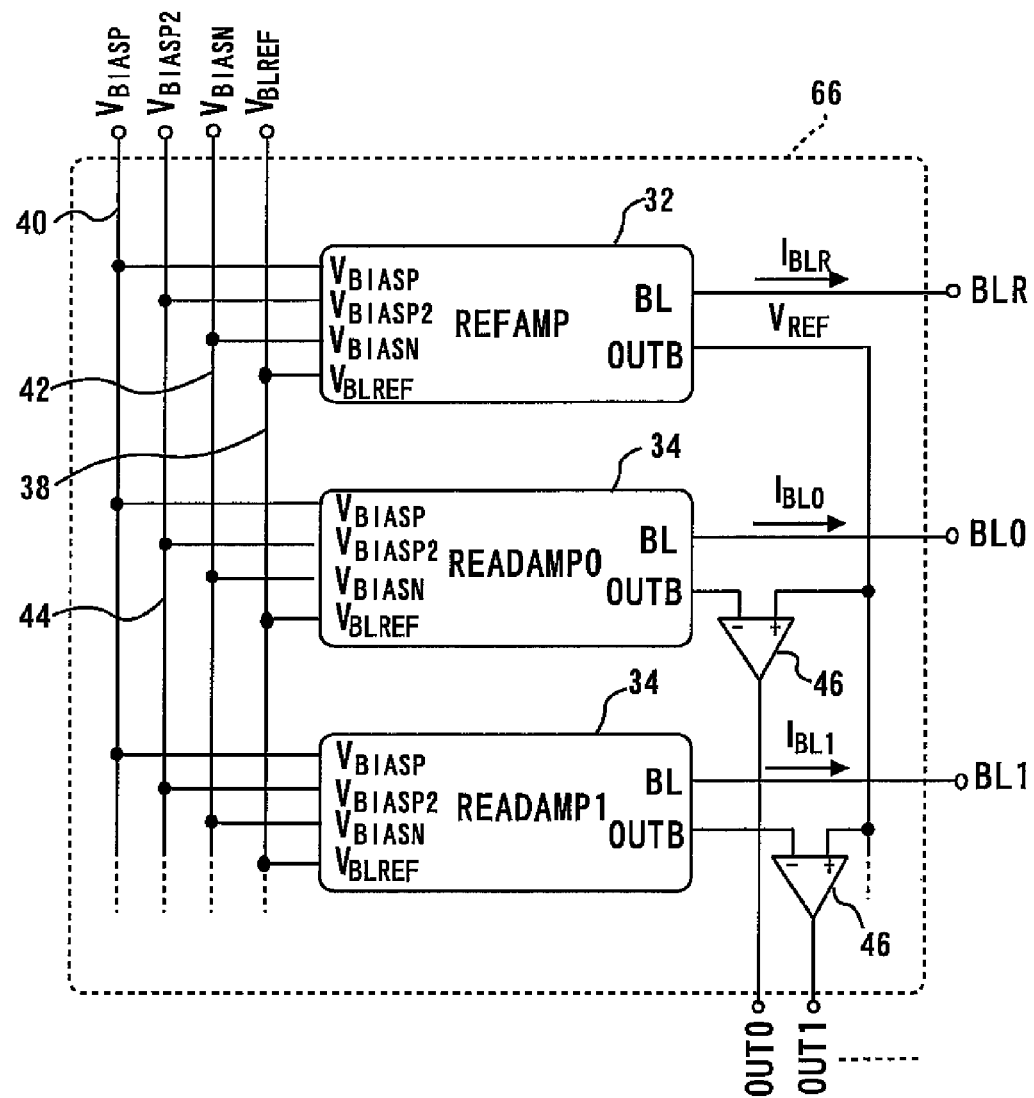
FIG. 6 is a schematic block diagram showing an amplifier block circuit relative to the 2nd embodiment.

Also, as shown in FIG. 6, the amplifier block circuit 66 relative to the present 2nd embodiment has discrepancies different from the amplifier block circuit 30 of the 1st embodiment in that the voltage generator circuit 36 is omitted, and the single reference sense amplifier circuit 32 and a plurality of readout sense amplifier circuits 34 are made up by the sense amplifier circuits 60 respectively.

The individual sense amplifier circuit 60, which constitutes the single reference sense amplifier circuit 32 and a plurality of readout sense amplifier circuits 34, has a 2nd bias voltage input terminal connected to a gate of the PMOS transistor 54 connected to the 2nd bias voltage supply line 44. This 2nd bias voltage supply line 44 is not connected to the voltage generator circuit 36, differently than the 1st embodiment. The 2nd bias voltage supply line 44 is connected to an external circuit (not shown). The external circuit supplies the bias voltage $V_{BIASP2}$ to the 2nd bias voltage supply line 44 so that the bias voltage $V_{BIASP2}$ is supplied to a gate of the PMOS transistor 54 of the individual sense amplifier circuit 60 via the 2nd bias voltage supply line 44. In addition, the reference voltage input terminal of the individual sense amplifier circuit 60 (connected to the inversion input terminal of the operational amplifier 64) is connected to another external circuit (not shown) via the reference voltage supply line 38. The particular external circuit supplies the reference voltage $V_{BLREF}$ to the reference voltage supply line 38 so that the reference voltage $V_{BLREF}$ is supplied to the inversion input terminal of the operational amplifier 64 in the individual sense amplifier circuits 60 via the reference voltage supply line 38.

In the sense amplifier circuit 60 relative to the present 2nd embodiment, the amount of the bias voltage $V_{BIASP}$ supplied to a gate of the PMOS transistor 52 and the characteristic of the PMOS transistor 52 are adjusted so that the PMOS transistor 52 operates in the linear region. In addition, the amount of the bias voltage $V_{BIASP2}$ supplied to a gate of the PMOS transistor 54 and the characteristic of the PMOS transistor 54 are adjusted so that the PMOS transistor 54 operates in the saturation region. In addition, the amount of the bias voltage $V_{BIASN}$ supplied to a gate of the NMOS transistor 56 and the characteristic of the NMOS transistor 56 are adjusted so that the NMOS transistor 56 operates in the saturation region.

Besides the sense amplifier circuit 60 corresponds to the data readout circuit of the foregoing 3rd aspect, in detailed, the PMOS transistor 52 of the sense amplifier circuit 60 corresponds to the 1st PMOS transistor of the foregoing 3rd aspect, and the PMOS transistor 54 corresponds to the 2nd PMOS transistor of the foregoing 3rd aspect, and the NMOS transistor 56 corresponds to the 1st NMOS transistor of the foregoing 3rd aspect, and the PMOS transistor 62 corresponds to the 4th PMOS transistor of the foregoing 3rd aspect, and the operational amplifier 64 corresponds to the differential amplifier section of the foregoing 3rd aspect. In addition, the bias voltage $V_{BIASP}$ supplied to a gate of the PMOS transistor 52 corresponds to the 1st bias voltage of the foregoing 3rd aspect (specifically the foregoing 5th aspect), and the bias voltage $V_{BIASP2}$ supplied to a gate of the PMOS transistor 54 corresponds to the 2nd bias voltage of the foregoing 3rd aspect, and the bias voltage $V_{BIASN}$ supplied to a gate of the NMOS transistor 56 corresponds to the 3rd bias voltage of the foregoing 3rd aspect.

In addition, the MOS type semiconductor memory device 10 including the amplifier block circuit 66 relative to the present 2nd embodiment corresponds to the semiconductor memory device of the foregoing 8th aspect. The memory cell array 12 corresponds to the memory cell array of the foregoing 8th aspect, and the operational amplifier 46 corresponds to the comparator circuit of the foregoing 8th aspect, and the readout sense amplifier circuit 34 composed of the sense amplifier circuit 60 corresponds to the data reading section of the foregoing 8th aspect, and the reference sense amplifier circuit 32 composed of the sense amplifier circuit 60 corresponds to the reference voltage supply section of the foregoing 8th aspect.

Next, operations of the sense amplifier circuit 60 relative to the present 2nd embodiment will now will described as an effect of the present 2nd embodiment. In order to read data out from the memory cell 14, it is necessary that the input terminal BL of the individual sense amplifier circuit 60 is kept at the reference voltage $V_{BLREF}$ and the reference voltage $V_{BLREF}$ supplied to a drain of the memory cell 14 of the data readout object. For this, in the present 2nd embodiment, the operational amplifier 64 of the individual sense amplifier circuit 60 operates as the differential amplifier in similar to the operational amplifier 206, 216 of the sense amplifier circuit 200, 210 shown in FIG. 15. Therefore, the voltage at the input terminal BL is kept at the reference voltage $V_{BLREF}$ and the reference voltage $V_{BLREF}$ is supplied to a drain of the memory cell of the data readout object 14.

Figure 7A:
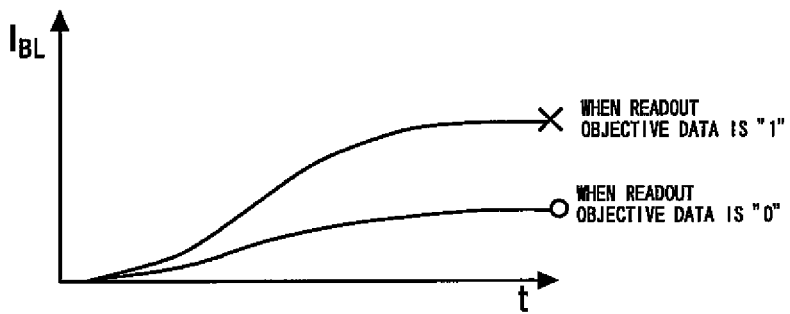
FIGS. 7A and 7B are graph diagrams each showing various changes of voltage at the time of data readout in the 2nd embodiment.
Figure 7B:
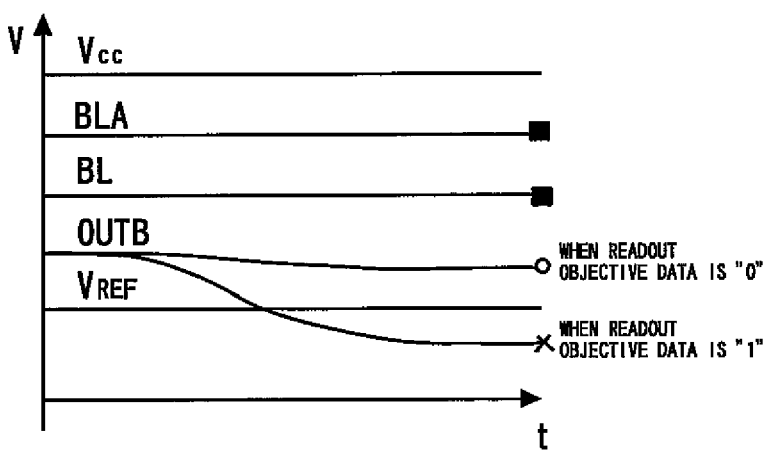

Thus it starts to read the readout objective data from the memory cell of the data readout object 14, and the outflow current $I_{BL}$ flows into the input terminal BL of the readout sense amplifier circuit 34 (consisted of the individual sense amplifier circuit 60), and the voltage at the node BLA of the individual sense amplifier circuit 60 has a voltage slightly decreased as shown in FIG. 7B at a notation "BLA", for example. Whereas, since the PMOS transistor 54 and the NMOS transistor 56 work in the saturation region, the source-drain current $I_{SDP}$ of the PMOS transistor 54 and the drain-source current $I_{DSN}$ of the NMOS transistor 56 do not change even if the voltage at the node BLA slightly decreases. In addition, since the PMOS transistor 54 functions as a gate ground amplifier circuit, when the voltage at the node BLA slightly decreases then the voltage at the output terminal OUTB relatively considerably decreases.

As a result, the amount of reduction of the output voltage at the output terminal OUTB. changes in response to the amount of the outflow current $I_{BL}$. Thus, as shown in FIG. 4A, when the readout objective data is "1" then the outflow current $I_{BL}$ is greater than that of the case the readout objective data is "0". Therefore the amount of reduction of the output voltage from the output terminal OUTB clearly differ in response to the readout objective data "1" or "0". The reference sense amplifier circuit 32 relative to the present 2nd embodiment (composed of the sense amplifier circuit 60) is configured similarly to the 1st embodiment so that the output voltage of the output terminal OUTB (i.e., the reference voltage $V_{REF}$ supplied to each operational amplifier 46) is determined to be equal to the middle voltage both of the output voltage after decreased correspondingly to the amount of the outflow current $I_{BL}$ when the readout objective data is "0" and the output voltage after decreased correspondingly to the amount of the outflow current $I_{BL}$ when the readout objective data is "1" (see FIG. 7B). Therefore the readout objective data "0" or "1", may be discriminated on the basis of output from each operational amplifier 46 operating as a differential amplifier.

Next, conditions in operations of the sense amplifier circuit 60 relative to the present 2nd embodiment will now be described. In directing the attention to the PMOS transistor 52, the inventors find conditions $V_{BLA}$ of the node BLA to make the PMOS transistor 52 operate in a linear region. Providing the threshold voltage of the PMOS transistor 52 is $V_{TP}$, there is obtained the following numerical formula:

$$V_{BLA} > V_{BIASP} + |V_{TP}| \tag{13}$$

Thus, the bias voltage $V_{BIASP}$ etc. supplied to the sense amplifier circuit 50 is adjusted so that the formula (13) is satisfied in the present 2nd embodiment. It is apparent from comparing the formula (13) with the foregoing operation condition formula (5) for the sense amplifier circuit 200 shown in FIG. 15A, and with the foregoing operation condition formula (10) for the sense amplifier circuit 210 shown in FIG. 15B, and with the foregoing operation condition formula (12) for the sense amplifier circuit 50 described in the 1st embodiment that the upper limit of the reference voltage $V_{BLREF}$ is not restricted or limited in the operation condition formula (13) of the sense amplifier circuit 60 relative to the present 2nd embodiment. Accordingly, the sense amplifier circuit 60 relative to the present 2nd embodiment has an excellent advantageous effect that the voltage of the input terminal BL is kept at the reference voltage $V_{BLREF}$ without any gain reduction even under the condition that the voltage Vcc of the power supply is in a lower level, alternatively the reference voltage of the input terminal is in a higher level than the reference voltage $V_{BLREF}$ even in comparison not only with the sense amplifier circuit 200 shown in FIG. 15A and the sense amplifier circuit 210 shown in FIG. 15B but also with the sense amplifier circuit 50 described in the 1st embodiment.

In addition, in the sense amplifier circuit 60 relative to the present 2nd embodiment, it is unnecessary to adjust the characteristic of the PMOS transistor 54 so that the transconductance coefficient K of the PMOS transistor 54 exceeds the predetermined value, although it is performed so the sense amplifier circuit 50 in the 1st embodiment. Therefore, the degree of freedom for the circuit design is improved by the present 2nd embodiment, and there is merit in easily designing the PMOS transistor 54 with a high speed operation.

[Third Embodiment]

Next, the 3rd embodiment of the present invention will now will described. In this embodiment, the same structures and portions as those in the 1st and 2nd embodiments are indicated by the same reference numerals, so description of the same structures will be omitted here.

Figure 8:
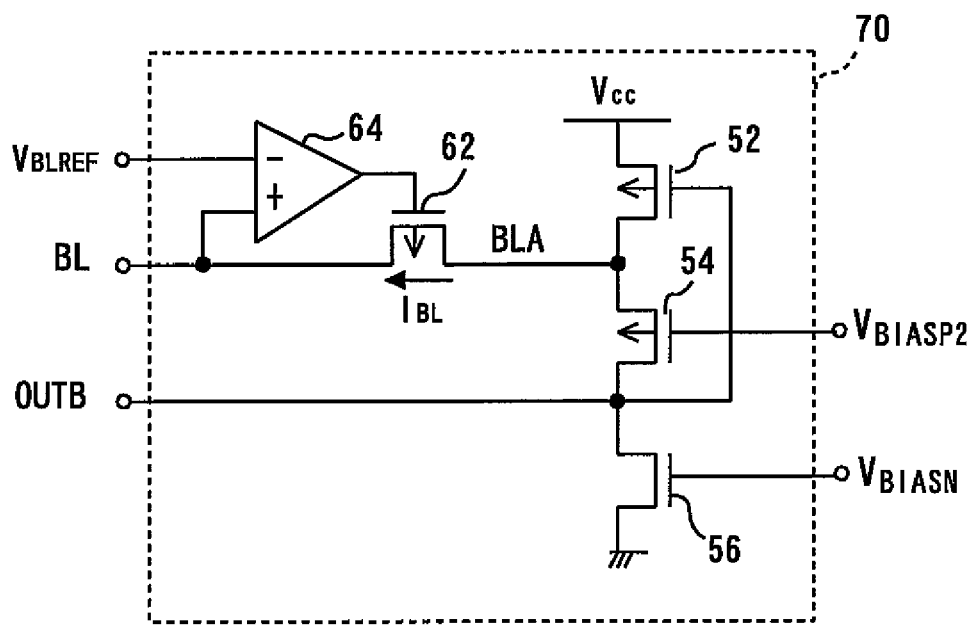
FIG. 8 is a circuit diagram showing a sense amplifier circuit relative to the 3rd embodiment.
Figure 9:
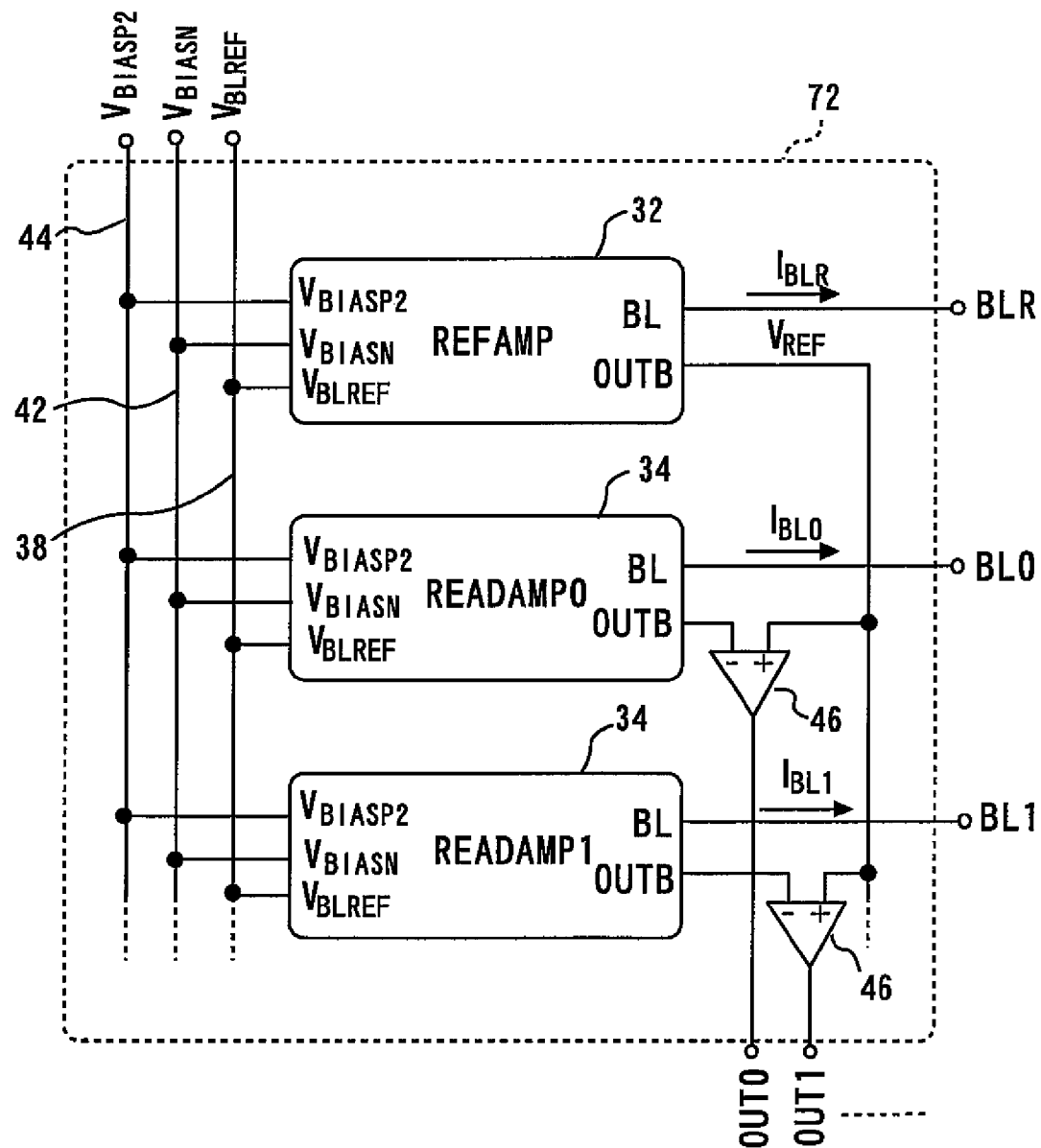
FIG. 9 is a schematic block diagram showing an amplifier block circuit relative to the 3rd embodiment.

As shown in FIG. 8, the sense amplifier circuit 70 relative to the present 3rd embodiment has discrepancies different from the sense amplifier circuit 60 of the 2nd embodiment in that the 1st bias voltage input terminal is omitted, and a gate of the PMOS transistor 52 is connected to the output terminal OUTB. In addition, as shown in FIG. 9, the amplifier block circuit 72 relative to the present 3rd embodiment has discrepancies different from the amplifier block circuit 66 of the 2nd embodiment in that the single reference sense amplifier circuit 32 and a plurality of readout sense amplifier circuits 34 are made up by the sense amplifier circuits 70 respectively and the 1st bias voltage supply line 40 is omitted.

Besides the sense amplifier circuit 70 corresponds to the data readout circuit of the foregoing 3rd aspect (specifically the foregoing 6th aspect), in detailed, the PMOS transistor 52 of the sense amplifier circuit 70 corresponds to the 1st PMOS transistor of the foregoing 3rd aspect (specifically the foregoing 6th aspect), and the PMOS transistor 54 corresponds to the 2nd PMOS transistor of the foregoing 3rd aspect, and the NMOS transistor 56 corresponds to the 1st NMOS transistor of the foregoing 3rd aspect, and the PMOS transistor 62 corresponds to the foregoing 4th PMOS transistor of the foregoing 3rd aspect, and the operational amplifier 64 corresponds to the differential amplifier section of the foregoing 3rd aspect. In addition, the MOS type semiconductor memory device 10 including the amplifier block circuit 72 relative to the present 3rd embodiment also corresponds to the semiconductor memory device of the foregoing 8th aspect. The memory cell array 12 corresponds to the memory cell array of the foregoing 8th aspect, and the operational amplifier 46 corresponds to the comparator circuit of the foregoing 8th aspect, and the readout sense amplifier circuit 34 composed of the sense amplifier circuit 70 corresponds to the data reading section of the foregoing 8th aspect, and the reference sense amplifier circuit 32 composed of the sense amplifier circuit 70 corresponds to the reference voltage supply section of the foregoing 8th aspect.

Next, operations of the sense amplifier circuit 70 relative to the present 3rd embodiment will now will described as an effect of the present 3rd embodiment, but showing only difference portions than that of the sense amplifier circuit 60 in the 2nd embodiment previously described. Since the sense amplifier circuit 70 relative to the present 3rd embodiment has a gate connected to the output terminal OUTB of the PMOS transistor 52, the PMOS transistor 52 functions as the gate ground amplifier circuit as well as the ON resistance of the PMOS transistor 52 changes in response to the change of the output voltage from the output terminal OUTB. Specifically, when the output voltage from the output terminal OUTB decreases then the ON resistance of the PMOS transistor 52 declines and the voltage at the node BLA rises. In addition, the output voltage from the output terminal OUTB rises then the ON resistance of the PMOS transistor 52 rises and the voltage at the node BLA decreases. These operations are feedback operations for the gate ground amplifier circuit composed of the PMOS transistor 52, so that the circuit operations improved in the stability.

In addition, the output voltage from the output terminal OUTB is inputted into the inversion input terminal of the operational amplifier 46 operating as a differential amplifier, and the output terminal OUTB is connected to a gate of the PMOS transistor 52. Therefore, the output voltage from the output terminal OUTB, the ON voltage of the PMOS transistor 52, specifically, is automatically adjusted to a voltage satisfied by the following formula, $$Vcc - V_{OUTB} > |V_{TP}|$$

where Vcc is the voltage of the power supply, $V_{OUTB}$ is the output voltage from the output terminal OUTB, and $V_{TP}$ is the threshold voltage of the PMOS transistor 52. As a result, the operation of the differential amplifier composed of the operational amplifier 46 is secured. By this, it is unnecessary to provide an external circuit which generates and supplies the bias voltage $V_{BIASP}$ to a gate of the PMOS transistor 52 to secure the operation of the differential amplifier. Therefore, the simplicity of the peripheral circuit configuration can be realized by the present 3rd embodiment in comparison with the sense amplifier circuit 60 as described in the 2nd embodiment.

[Fourth Embodiment]

Next, the 4th embodiment of the present invention will now will described. In this embodiment, the same structures and portions as those in the 1st to 3rd embodiments are indicated by the same reference numerals, so description of the same structures will be omitted here.

Figure 10:
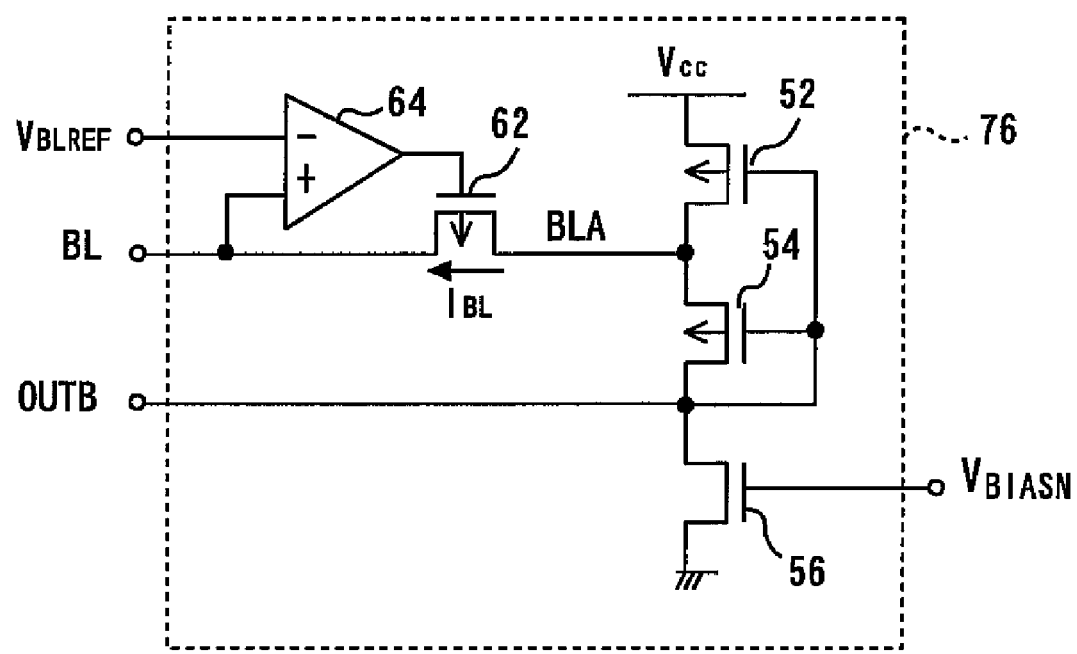
FIG. 10 is a circuit diagram showing a sense amplifier circuit relative to the 4th embodiment.
Figure 11:
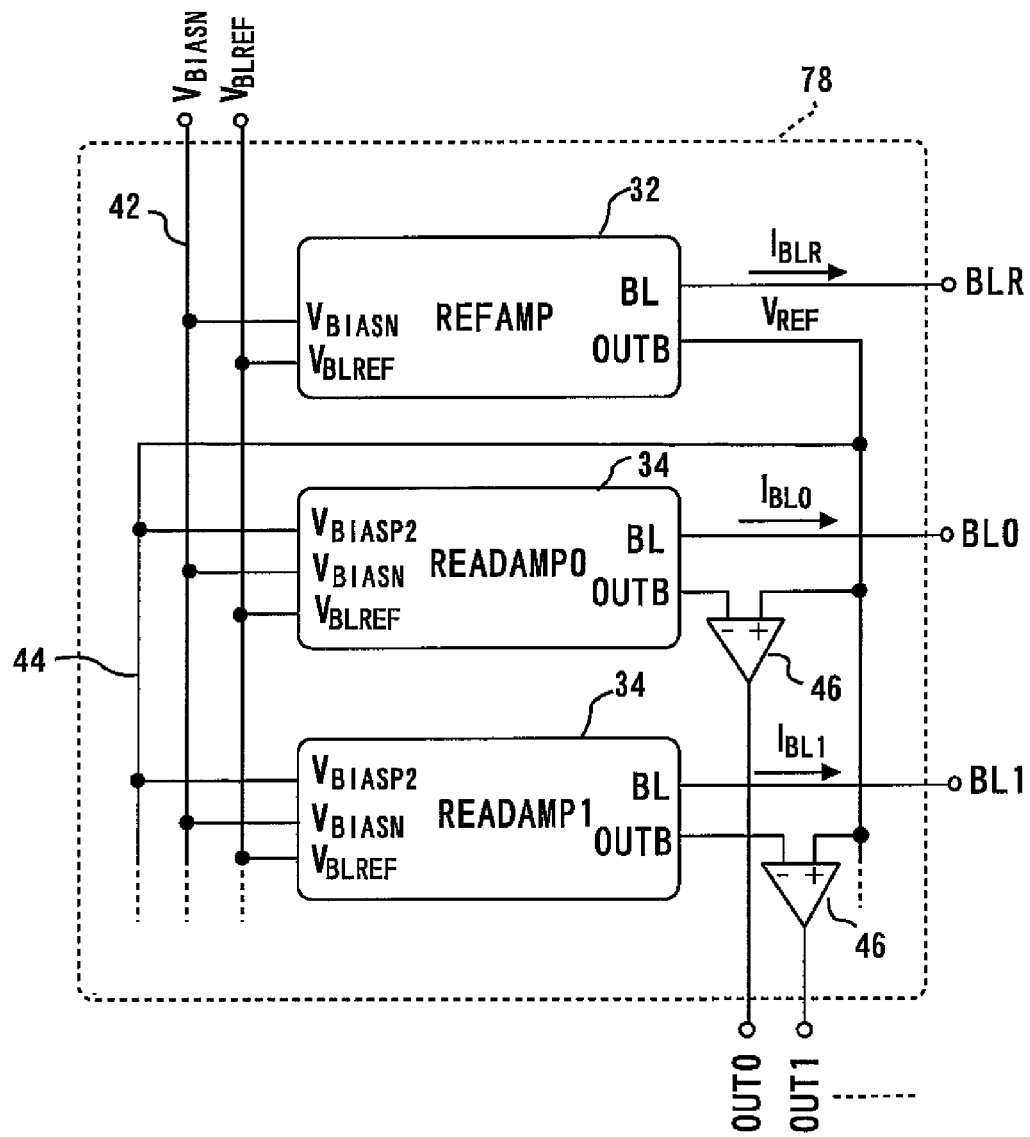
FIG. 11 is a schematic block diagram showing an amplifier block circuit relative to the 4th embodiment.
Figure 1:
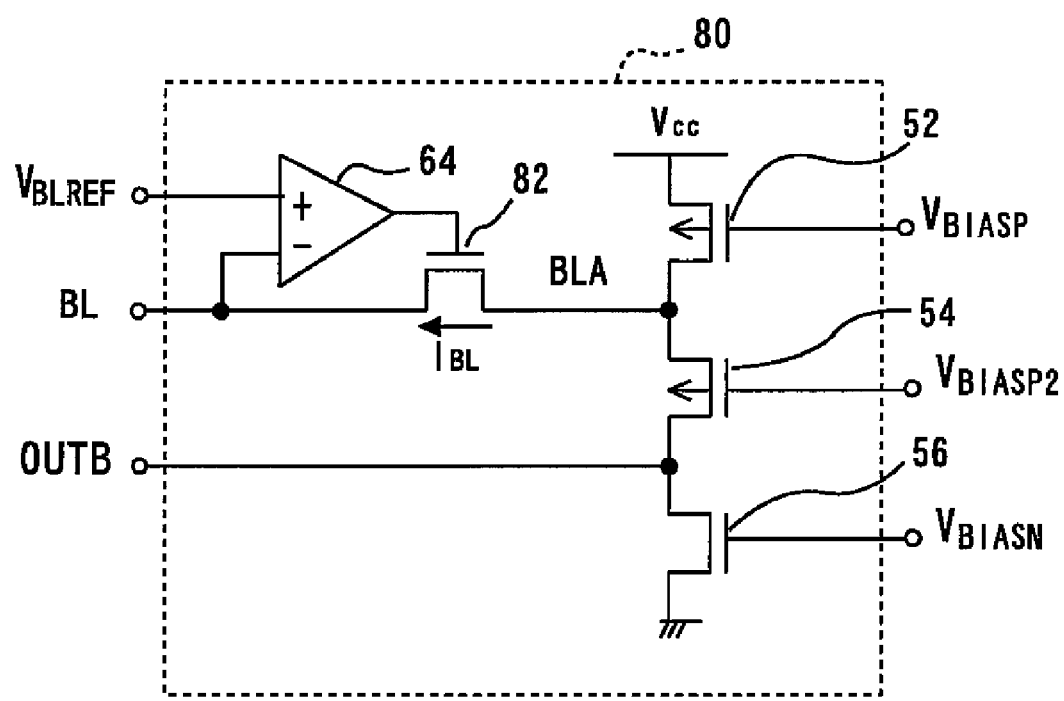

As shown in FIG. 10, the sense amplifier circuit 76 relative to the present 4th embodiment has discrepancies different from the sense amplifier circuit 70 of the 3rd embodiment in that the 2nd bias voltage input terminal is omitted, and a gate of the PMOS transistor 52 as well as a gate of the PMOS transistor 54 are connected to the output terminal OUTB. Also, as shown in FIG. 11, the amplifier block circuit 78 relative to the present 4th embodiment has discrepancies different from the amplifier block circuit 72 of the 3rd embodiment in that the reference sense amplifier circuit 32 is composed of the said sense amplifier circuit 76 (wherein each of the plural readout sense amplifier circuits 34 is composed of the sense amplifier circuit 70 of the 3rd embodiment similarly to the amplifier block circuit 72) and in that the 2nd bias voltage supply line 44, connected to the 2nd bias voltage input terminal of the readout sense amplifier circuits 34, is connected to the output terminal OUTB of the reference sense amplifier circuit 32, and in that the reference voltage $V_{REF}$ output from the reference sense amplifier circuit 32 is supplied to the PMOS transistor 54 of the readout sense amplifier circuits 34 as a gate of a bias voltage $V_{BIASP2}$.

Besides the sense amplifier circuit 76 corresponds to the data readout circuit of the foregoing 3rd aspect (specifically the foregoing 7th aspect), in detailed, the PMOS transistor 52 of the sense amplifier circuit 76 corresponds to the 1st PMOS transistor of the foregoing 3rd aspect (specifically the foregoing 7th aspect), and the PMOS transistor 54 corresponds to the 2nd PMOS transistor of the foregoing 3rd aspect, and the NMOS transistor 56 corresponds to the 1st NMOS transistor of the foregoing 3rd aspect, and the PMOS transistor 62 corresponds to the 4th PMOS transistor of the foregoing 3rd aspect, and the operational amplifier 64 corresponds to the differential amplifier section of the foregoing 3rd aspect. In addition, the MOS type semiconductor memory device 10 including the amplifier block circuit 78 relative to the present 4th embodiment also corresponds to the semiconductor memory device of the foregoing 9th aspect. The memory cell array 12 corresponds to the memory cell array of the foregoing 9th aspect, and the operational amplifier 46 corresponds to the comparator circuit of the foregoing 9th aspect, and the readout sense amplifier circuit 34 composed of the sense amplifier circuit 70 corresponds to the data reading section of the foregoing 9th aspect, and the reference sense amplifier circuit 32 composed of the sense amplifier circuit 76 corresponds to the reference voltage supply section of the foregoing 9th aspect.

Next, an effect of the present 4th embodiment will now will described. In the sense amplifier circuit 76 relative to the present 4th embodiment, since a gate of the PMOS transistor 54 is connected to the output terminal OUTB and the output voltage from the output terminal OUTB is supplied to a gate of the PMOS transistor 54, this configuration enable to secure the operation of the PMOS transistor 54 in the saturation region. In addition, the reference sense amplifier circuit 32 is comprised of the foregoing sense amplifier circuit 76 in the present 4th embodiment. Therefore, since the reference voltage $V_{REF}$ outputted from the reference sense amplifier circuit 32 (i.e., sense amplifier circuit 76) is supplied to the readout sense amplifier circuits 34 as the bias voltage $V_{BIASP2}$, it is unnecessary to provide the external circuit supplying the bias voltage $V_{BIASP2}$. Therefore, the simplicity of the peripheral circuit configuration can be realized by the present embodiment Besides, in the 4th embodiment, there has been explained the embodiment using the sense amplifier circuit 70 described in the 3rd embodiment as the readout sense amplifier circuit 34 corresponding to the data reading section of the foregoing 9th aspect, it is not limited by such embodiments. In the 4th embodiment, the sense amplifier circuit 66 described in the 2nd embodiment may be used as the readout sense amplifier circuit 34.

[Fifth Embodiment]

Next, the 5th embodiment of the present invention will now will described. In this embodiment, the same structures and portions as those in the 2nd embodiment are indicated by the same reference numerals, so description of the same structures will be omitted here.

As shown in FIG. 12, the sense amplifier circuit 80 relative to the present 5th embodiment has discrepancies different from the sense amplifier circuit 60 of the 2nd embodiment in that the NMOS transistor 82 is provided instead of the PMOS transistor 62 of the sense amplifier circuit 60 of the 2nd embodiment. Also the operational amplifier 64 comprises: a non-inversion input terminal connected to the reference voltage input terminal to which the reference voltage $V_{BLREF}$ is supplied; an inversion input terminal connected to the input terminal BL; and an output terminal connected to a gate of the NMOS transistor 82.

Besides the sense amplifier circuit 80 corresponds to the data readout circuit of the foregoing 4th aspect, in detailed, the PMOS transistor 52 of the sense amplifier circuit 80 corresponds to the 1st PMOS transistor of the foregoing 4th aspect, and the PMOS transistor 54 corresponds to the 2nd PMOS transistor of the foregoing 4th aspect, and the NMOS transistor 56 corresponds to the 1st NMOS transistor of the foregoing 4th aspect, and the NMOS transistor 82 corresponds to the 2nd NMOS transistor of the foregoing 4th aspect, and the operational amplifier 64 corresponds to the differential amplifier section of the foregoing 4th aspect. In addition, the bias voltage $V_{BIASP}$ supplied to a gate of the PMOS transistor 52 corresponds to the 1st bias voltage of the foregoing 4th aspect (specifically the foregoing 5th aspect), and the bias voltage $V_{BIASP2}$ supplied to a gate of the PMOS transistor 54 corresponds to the 2nd bias voltage of the foregoing 4th aspect, and the bias voltage $V_{BIASN}$ supplied to a gate of the NMOS transistor 56 corresponds to the 3rd bias voltage of the foregoing 4th aspect.

Next, operations of the sense amplifier circuit 80 relative to the present 5th embodiment will now will described as an effect of the present 5th embodiment, but showing only difference portions than that of the sense amplifier circuit 60 in the 2nd embodiment previously described. The sense amplifier circuit 80 relative to the present 5th embodiment comprises a NMOS transistor 82 instead of the PMOS transistor 62 in the sense amplifier circuit 60 of the 2nd embodiment. Generally, in such a circuit configuration, a high speed and stable operation is expected by using the NMOS transistor rather than the PMOS transistor. In this case, for putting the NMOS transistor 82 into a state ON, it should be taken consideration of the threshold voltage $V_{TN}$ of the NMOS transistor 82. Specifically, the voltage at the output terminal of the operational amplifier 64 must be a high voltage greater than the reference voltage $V_{BLREF}$ with an amount of the threshold voltage $V_{TN}$ of the NMOS transistor 82 higher. Accordingly, if the voltage of the power supply Vcc might be a relatively low voltage or the reference voltage $V_{BLREF}$ might be a relatively high voltage then it would be difficult to use the circuit.

In this embodiment, the other circuit configuration, circuit operations and the like as those in the 2nd embodiment are indicated by the same reference numerals, so description of the same structures will be omitted here.

[Sixth Embodiment]

Next, the 6th embodiment according to the present invention will now will described. In this embodiment, the same structures and portions as those in the 3rd embodiment are indicated by the same reference numerals, so description of the same structures will be omitted here.

Figure 13:
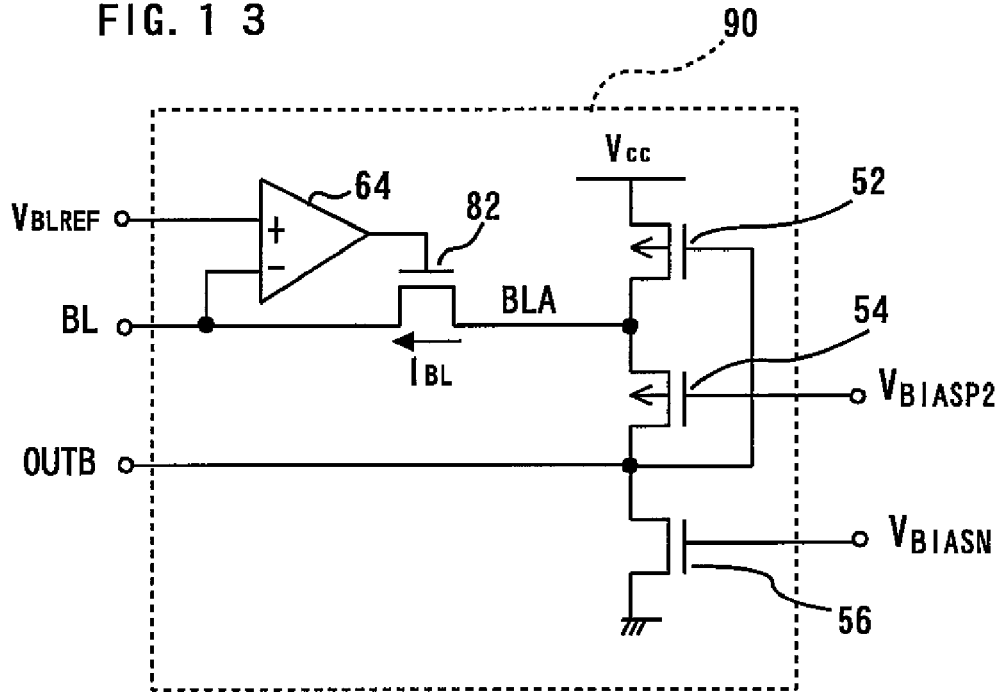
FIG. 13 is a circuit diagram showing a sense amplifier circuit relative to the 6th embodiment.

As shown in FIG. 13, the sense amplifier circuit 90 relative to the present 6th embodiment has discrepancies different from the sense amplifier circuit 70 of the 3rd embodiment in that the NMOS transistor 82 is provided instead of the PMOS transistor 62 in the sense amplifier circuit 70 of the 3rd embodiment. Also the operational amplifier 64 comprises: a non-inversion input terminal connected to the reference voltage input terminal to which the reference voltage $V_{BLREF}$ is supplied; an inversion input terminal connected to the input terminal BL; and an output terminal connected to a gate of the NMOS transistor 82.

Besides the sense amplifier circuit 90 corresponds to the data readout circuit of the foregoing 4th aspect (specifically the foregoing 6th aspect), in detailed, the PMOS transistor 52 of the sense amplifier circuit 90 corresponds to the 1st PMOS transistor of the foregoing 4th aspect (specifically the foregoing 6th aspect), and the PMOS transistor 54 corresponds to the 2nd PMOS transistor of the foregoing 4th aspect, and the NMOS transistor 56 corresponds to the 1st NMOS transistor of the foregoing 4th aspect, and the NMOS transistor 82 corresponds to the 2nd NMOS transistor of the foregoing 4th aspect, and the operational amplifier 64 corresponds to of the foregoing 4th aspect the differential amplifier section of the foregoing 4th aspect.

Next, operations of the sense amplifier circuit 90 relative to the present 6th embodiment will now will described as an effect of the present 6th embodiment, but showing only difference portions than that of the sense amplifier circuit 70 in the 3rd embodiment previously described. The sense amplifier circuit 90 relative to the present 6th embodiment comprises a NMOS transistor 82 instead of the PMOS transistor 62 in the sense amplifier circuit 70 of the 3rd embodiment. Generally, in such a circuit configuration, a high speed and stable operation is expected by using the NMOS transistor rather than the PMOS transistor. In this case, for putting the NMOS transistor 82 into a state ON, it should be taken consideration of the threshold voltage $V_{TN}$ of the NMOS transistor 82. Specifically, the voltage at the output terminal of the operational amplifier 64 must be a high voltage greater than the reference voltage $V_{BLREF}$ with an amount of the threshold voltage $V_{TN}$ of the NMOS transistor 82 higher. Accordingly, if the voltage of the power supply Vcc might be a relatively low voltage or the reference voltage $V_{BLREF}$ might be a relatively high voltage then it would be difficult to use the circuit.

In this embodiment, the other circuit configuration, circuit operations and the like as those in the 3rd embodiment are indicated by the same reference numerals, so description of the same structures etc. will be omitted here.

[Seventh Embodiment]

Next, the 7th embodiment of the present invention now will be described. In this embodiment, the same structures and portions as those in the 4th embodiment are indicated by the same reference numerals, so description of the same structures will be omitted here.

Figure 14:
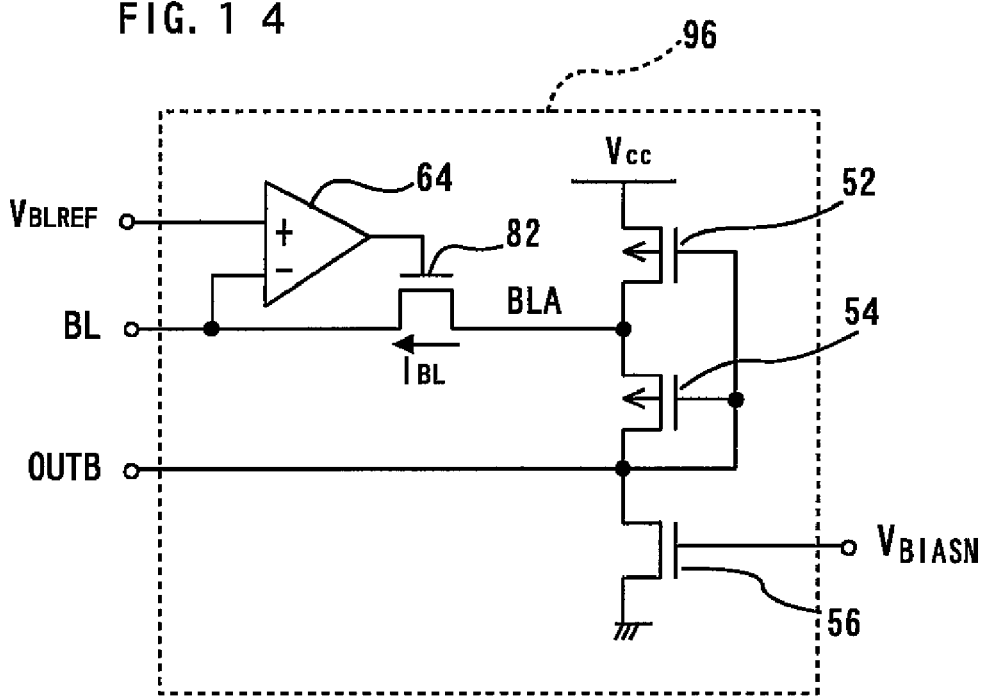
FIG. 14 is a circuit diagram showing a sense amplifier circuit relative to the 7th embodiment.

As shown in FIG. 14, the sense amplifier circuit 96 relative to the present 7th embodiment has discrepancies different from the sense amplifier circuit 76 of the 4th embodiment in that the NMOS transistor 82 is provided instead of the PMOS transistor 62 in the sense amplifier circuit 76 of the 4th embodiment. Also the operational amplifier 64 comprises: a non-inversion input terminal connected to the reference voltage input terminal to which the reference voltage $V_{BLREF}$ is supplied; an inversion input terminal connected to the input terminal BL; and an output terminal connected to a gate of the NMOS transistor 82.

Besides the sense amplifier circuit 90 corresponds to the data readout circuit of the foregoing 4th aspect (specifically the foregoing 7th aspect), in detailed, the PMOS transistor 52 of the sense amplifier circuit 90 corresponds to the 1st PMOS transistor of the foregoing 4th aspect (specifically the foregoing 7th aspect), and the PMOS transistor 54 corresponds to the 2nd PMOS transistor of the foregoing 4th aspect (specifically the foregoing 7th aspect), and the NMOS transistor 56 corresponds to of the foregoing 4th aspect the 1st NMOS transistor of the foregoing 4th aspect, and the NMOS transistor 82 corresponds to the 2nd NMOS transistor of the foregoing 4th aspect, and the operational amplifier 64 corresponds to the differential amplifier section of the foregoing 4th aspect. In addition, the sense amplifier circuit 96 relative to the present 7th embodiment is used as the single reference sense amplifier circuit 32 of the amplifier block circuit in a similar manner to the sense amplifier circuit 76 of the 4th embodiment.

Next, operations of the sense amplifier circuit 96 relative to the present 7th embodiment will now will described as an effect of the present 7th embodiment, but showing only difference portions than that of the sense amplifier circuit 76 in the 4th embodiment previously described. The sense amplifier circuit 96 relative to the present 7th embodiment comprises a NMOS transistor 82 instead of the PMOS transistor 62 in the sense amplifier circuit 76 of the 4th embodiment. Generally, in such a circuit configuration, a high speed and stable operation is expected by using the NMOS transistor rather than the PMOS transistor. In this case, for putting the NMOS transistor 82 Into a state ON, it should be taken consideration of the threshold voltage $V_{TN}$ of the NMOS transistor 82. Specifically, the voltage at the output terminal of the operational amplifier 64 must be a high voltage greater than the reference voltage $V_{BLREF}$ with an amount of the threshold voltage $V_{TN}$ of the NMOS transistor 82 higher. Accordingly, if the voltage of the power supply Vcc might be a relatively low voltage or the reference voltage $V_{BLREF}$ might be a relatively high voltage then it would be difficult to use the circuit.

In this embodiment, the other circuit configuration, circuit operations and the like as those in the 4th embodiment are indicated by the same reference numerals, so description of the same structures etc. will be omitted here.

In addition, the data readout circuit capable of reading data out according to the present invention may be adapted to a memory cell other than EPROM, such as EEPROM, flash memory and the like as long as the memory (cell) is configured so that the amount of flowing current changes in response to the value of data stored therein under the condition a constant voltage is supplied thereto.

As described in embodiments, according to the present invention, there is provided a semiconductor memory device comprising: a memory cell array comprised of a plurality of memory cells capable of storage of data; a comparator circuit for comparing a 1st voltage inputted into a 1st input terminal with a 2nd voltage inputted into the 2nd input terminal to output a comparison result; a data reading section including the data readout circuit set forth in any one of the foregoing 1st to 6th aspects, wherein said input terminal is connected to the memory cell of the data readout object, and said output terminal is connected to said 1st input terminal of said comparator circuit; and a reference voltage supply section including the data readout circuit set forth in any one of the foregoing 1st to 6th aspects, wherein said output terminal is connected to said 2nd input terminal of said comparator circuit.

Furthermore, as described in embodiments, according to the present invention, there is further provided a semiconductor memory device comprising: a memory cell array comprised of a plurality of memory cells capable of storage of data; a comparator circuit for comparing a 1st voltage inputted into a 1st input terminal with a 2nd voltage inputted into the 2nd input terminal to output a comparison result; a data reading section including the data readout circuit set forth in any one of the foregoing 3rd to 6th aspects, wherein said input terminal is connected to the memory cell of the data readout object, and said output terminal is connected to said 1st input terminal of said comparator circuit; and a reference voltage supply section including the data readout circuit set forth in the foregoing 7th aspect, wherein said output terminal is connected to said 2nd input terminal of said comparator circuit and the gate of said 2nd PMOS transistor respectively.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2008-187721 filed on Jul. 18, 2008 and the entire disclosure thereof is incorporated herein by reference.

What is claimed is:

1. A data readout circuit comprising:
   a 1st PMOS transistor configured to operate in a saturation region and including a source connected to a power supply, a drain connected to an input terminal connected to a memory cell of a data readout object, and a gate to which a 1st bias voltage is supplied;
   a 2nd PMOS transistor including a source connected to the drain of said 1st PMOS transistor, a drain connected to an output terminal, and a gate to which a 2nd bias voltage is supplied;
   a 1st NMOS transistor including a drain connected to the drain of said 2nd PMOS transistor, a source grounded, and a gate to which a 3rd bias voltage is supplied; and
   a bias voltage supply section causing said 2nd PMOS transistor to operate in a saturation region and supplying the 2nd bias voltage to the gate of the 2nd PMOS transistor, wherein the 2nd bias voltage is adjusted so as to keep a reference voltage of said input terminal at a junction point between the drain of said 1st PMOS transistor and the source of said 2nd PMOS transistor.

2. The data readout circuit according to claim 1, wherein said bias voltage supply section comprising:
   a 3rd PMOS transistor including a source to which the reference voltage of said input terminal is supplied, a gate connected to the gate of said 2nd PMOS transistor, and a drain short-circuited to the gate; and
   a constant current supply connected to the drain of said 3rd PMOS transistor,
   wherein said 2nd PMOS transistor and said 3rd PMOS transistor form a current minor circuit,
   wherein when supplying the 2nd bias voltage to the gate of the 2nd PMOS transistor, the 2nd bias voltage represented by an inequality below is satisfied, $V_{BLREF} < V_{BIASP} + |V_{TP}|$ where $V_{TP}$ denotes a threshold voltage of said 1st PMOS transistor, $V_{BIASP}$ denotes said 1st bias voltage and $V_{BLREF}$ denotes the 2nd bias voltage.

3. A data readout circuit comprising:
   a 1st PMOS transistor configured to operate in a linear region and including a source connected to a power supply, and a gate to which a 1st bias voltage is supplied;
   a 2nd PMOS transistor configured to operate in a saturation region and including a source connected to a drain of said 1st PMOS transistor, a gate to which a 2nd bias voltage is supplied, and a drain connected to an output terminal;
   a 1st NMOS transistor configured to operate in a saturation region and including a drain connected to the drain of said 2nd PMOS transistor, a source grounded, and a gate to which a 3rd bias voltage is supplied;
   a 4th PMOS transistor including a source connected to the drain of said 1st PMOS transistor, and a drain connected to an input terminal connected to a memory cell of a data readout object; and
   a differential amplifier section to which a reference voltage of said input terminal is inputted and connected to said 4th PMOS transistor so that the reference voltage of said input terminal is maintained at the drain of said 4th PMOS transistor.

4. The data readout circuit according to claim 3, wherein said 1st bias voltage is supplied to said 1st PMOS transistor so that an inequality represented below is satisfied, $V_{BLA} > V_{BIASP} + |V_{TP}|$ where $V_{TP}$ denotes a threshold voltage of said 1st PMOS transistor, $V_{BIASP}$ denotes said 1st bias voltage, and $V_{BLA}$ denotes a voltage at a node connected to the drain of said 1st PMOS transistor and the source of said 2nd PMOS transistor.

5. The data readout circuit according to claim 4, wherein the gate of said 1st PMOS transistor is connected to said output terminal.

6. The data readout circuit according to claim 5, wherein the gates of said 1st PMOS transistor and said 2nd PMOS transistor are connected to said output terminal.

7. A data readout circuit comprising:
   a 1st PMOS transistor configured to operate in a linear region and including a source connected to a power supply, and a gate to which a 1st bias voltage is supplied;
   a 2nd PMOS transistor configured to operate in a saturation region and including a source connected to a drain of said 1st PMOS transistor, a gate to which a 2nd bias voltage is supplied, and a drain connected to an output terminal;
   a 1st NMOS transistor configured to operate in a saturation region and including a drain connected to the drain of said 2nd PMOS transistor, a source grounded, and a gate to which a 3rd bias voltage is supplied;
   a 2nd NMOS transistor including a drain connected to the drain of said 1st PMOS transistor, and a source connected to an input terminal connected to a memory cell of a data readout object; and
   a differential amplifier section to which a reference voltage of said input terminal is inputted and connected to said 2nd NMOS transistor so that the reference voltage of said input terminal is maintained at the source of said 2nd NMOS transistor.

8. The data readout circuit according to claim 7, wherein said 1st bias voltage is supplied to said 1st PMOS transistor so that an inequality represented below is satisfied, $V_{BLA} > V_{BIASP} + |V_{TP}|$ where $V_{TP}$ denotes a threshold voltage of said 1st PMOS transistor, $V_{BIASP}$ denotes said 1st bias voltage, and $V_{BLA}$ denotes a voltage at a node BLA connected to the drain of said 1st PMOS transistor and the source of said 2nd PMOS transistor.

9. The data readout circuit according to claim 8, wherein the gate of said 1st PMOS transistor is connected to said output terminal.

10. The data readout circuit according to claim 9, wherein the gates of said 1st PMOS transistor and said 2nd PMOS transistor are connected to said output terminal.

* * * * *